(12) United States Patent
Bae et al.

(10) Patent No.: US 12,094,976 B2
(45) Date of Patent: Sep. 17, 2024

(54) SEMICONDUCTOR DEVICE

(71) Applicant: Samsung Electronics Co., Ltd., Suwon-si (KR)

(72) Inventors: Deok Han Bae, Suwon-si (KR); Ju Hun Park, Seoul (KR); Myung Yoon Um, Seoul (KR); Yu Ri Lee, Hwaseong-si (KR); In Yeal Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/558,967

(22) Filed: Dec. 22, 2021

(65) Prior Publication Data

US 2022/0336664 A1 Oct. 20, 2022

(30) Foreign Application Priority Data

Apr. 19, 2021 (KR) .......................... 10-2021-0050293

(51) Int. Cl.
*H01L 29/78* (2006.01)
*H01L 29/08* (2006.01)

(52) U.S. Cl.
CPC ...... *H01L 29/7851* (2013.01); *H01L 29/0847* (2013.01)

(58) Field of Classification Search
CPC ......... H01L 21/76897; H01L 21/76816; H01L 21/823431; H01L 21/823475;

(Continued)

(56) References Cited

U.S. PATENT DOCUMENTS 9,640,436 B1 5/2017 Cheng et al.
9,691,897 B2 6/2017 Xie et al.
(Continued)

OTHER PUBLICATIONS

EP Partial Search Report dated Jun. 30, 2022 for corresponding patent EP 22 152 706.2.

(Continued)

*Primary Examiner* — David C Spalla
(74) *Attorney, Agent, or Firm* — Muir Patent Law, PLLC

(57) ABSTRACT

A semiconductor device includes a first fin-shaped pattern which extends lengthwise in a first direction, a second fin-shaped pattern which is spaced apart from the first fin-shaped pattern in a second direction and extends lengthwise in the first direction, a first gate electrode extending lengthwise in the second direction on the first fin-shaped pattern, a second gate electrode extending lengthwise in the second direction on the second fin-shaped pattern, a first gate separation structure which separates the first gate electrode and the second gate electrode and is at the same vertical level as the first gate electrode and the second gate electrode, and a first source/drain contact extending lengthwise in the second direction on the first fin-shaped pattern and the second fin-shaped pattern. The first source/drain contact includes a first lower source/drain contact region which intersects the first fin-shaped pattern and the second fin-shaped pattern, and a first upper source/drain contact region which protrudes from the first lower source/drain contact region, and the first upper source/drain contact region does not overlap the first gate separation structure in the first direction.

20 Claims, 31 Drawing Sheets

(58) Field of Classification Search
CPC ........... H01L 21/823821; H01L 21/845; H01L 23/535; H01L 27/0886; H01L 27/0924; H01L 27/1211; H01L 29/0847; H01L 29/41791; H01L 29/66795; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 9,960,241 | B2 | 5/2018 | Park et al. |
| 10,164,034 | B2 | 12/2018 | Huang et al. |
| 10,366,989 | B2 | 7/2019 | Chang et al. |
| 10,522,538 | B1 | 12/2019 | Wang et al. |
| 10,867,870 | B1* | 12/2020 | Yang ................ H01L 21/31116 |
| 11,123,217 | B2* | 9/2021 | Dastrup .................. A61F 5/485 |
| 2013/0126978 | A1 | 5/2013 | Becker et al. |
| 2016/0111341 | A1 | 4/2016 | Kim |
| 2018/0211955 | A1 | 7/2018 | Greene et al. |
| 2018/0358345 | A1* | 12/2018 | Qian ..................... H01L 23/535 |
| 2019/0148384 | A1* | 5/2019 | Bae ..................... H01L 23/5226 257/330 |
| 2019/0363085 | A1* | 11/2019 | Oh ...................... H01L 27/0886 |
| 2020/0135872 | A1 | 4/2020 | Zang et al. |
| 2020/0365602 | A1 | 11/2020 | Yang et al. |
| 2021/0028109 | A1 | 1/2021 | Youn et al. |
| 2021/0074697 | A1 | 3/2021 | Baek et al. |
| 2021/0193683 | A1 | 6/2021 | Yang et al. |
| 2021/0305427 | A1 | 9/2021 | Bae et al. |
| 2022/0310454 | A1* | 9/2022 | Pan ................... H01L 21/76865 |
| 2023/0352345 | A1* | 11/2023 | Wu ..................... H01L 29/0642 |

OTHER PUBLICATIONS

EESR dated Sep. 28, 2022 for corresponding patent EP 22 152 706.2.
Sherazi S M Yasser et. al., "Standard-cell design architecture options below 5nm node: The ultimate scaling of FinFET and Nanosheet", SPIE Proceedings; [Proceedings of SPIE ISSN 0277-786X], Mar. 27, 2019, vol. 10962.

* cited by examiner

SEMICONDUCTOR DEVICE

This application claims priority to Korean Patent Application No. 10-2021-0050293 filed on Apr. 19, 2021 in the Korean Intellectual Property Office, the disclosure of which is incorporated herein by reference in its entirety.

BACKGROUND

1. Field of the Invention

The present invention relates to a semiconductor device.

2. Description of the Related Art

As one of scaling technologies for increasing density of semiconductor devices, a multi gate transistor in which a fin-shaped or nanowire-shaped multi-channel active pattern (or a silicon body) is formed on a substrate and a gate is formed on a surface of the multi-channel active pattern has been proposed.

Since such a multi gate transistor utilizes three-dimensional channels, scaling is easily performed. Further, even if a gate length of the multi gate transistor is not increased, current control capability may be improved. Furthermore, a SCE (short channel effect) in which potential of a channel region is influenced by a drain voltage may be effectively suppressed.

SUMMARY

Aspects of the present invention provide a semiconductor device having improved reliability and performance.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present disclosure, a semiconductor device comprises a first fin-shaped pattern which extends lengthwise in a first direction, a second fin-shaped pattern which is spaced apart from the first fin-shaped pattern in a second direction and extends lengthwise in the first direction, a first gate electrode extending lengthwise in the second direction on the first fin-shaped pattern, a second gate electrode extending lengthwise in the second direction on the second fin-shaped pattern, a first gate separation structure which separates the first gate electrode and the second gate electrode and is at the same vertical level as the first gate electrode and the second gate electrode, and a first source/drain contact extending lengthwise in the second direction on the first fin-shaped pattern and the second fin-shaped pattern. The first source/drain contact includes a first lower source/drain contact region which intersects the first fin-shaped pattern and the second fin-shaped pattern, and a first upper source/drain contact region which protrudes from the first lower source/drain contact region, and the first upper source/drain contact region does not overlap the first gate separation structure in the first direction.

According to another aspect of the present disclosure, a semiconductor device comprises a first fin-shaped pattern and a second fin-shaped pattern each extending lengthwise in a first direction; a third fin-shaped pattern spaced apart from the first fin-shaped pattern in a second direction and extending lengthwise in the first direction; a fourth fin-shaped pattern spaced apart from the second fin-shaped pattern in the second direction and extending lengthwise in the first direction; an element separation structure which separates the first fin-shaped pattern and the second fin-shaped pattern, and the third fin-shaped pattern and the fourth fin-shaped pattern; a first source/drain contact extending lengthwise in the second direction, on the first fin-shaped pattern and the third fin-shaped pattern; a first gate electrode extending lengthwise in the second direction, on the first fin-shaped pattern between the first source/drain contact and the element separation structure; a second gate electrode extending lengthwise in the second direction, on the third fin-shaped pattern between the first source/drain contact and the element separation structure; and a gate separation structure which separates the first gate electrode and the second gate electrode. The first source/drain contact includes a first lower source/drain contact region that intersects the first fin-shaped pattern and the third fin-shaped pattern, and a first upper source/drain contact region that protrudes from the first lower source/drain contact region. The first gate electrode and the second gate electrode each includes a first long side wall which faces the element separation structure and extends in the second direction, and a second long side wall opposite to the first long side wall. The second long side wall of the first gate electrode and the second long side wall of the second gate electrode are bent toward the first source/drain contact, when approaching the gate separation structure.

According to still another aspect of the present disclosure, a semiconductor device comprises a first fin-shaped pattern extending lengthwise in a first direction; a second fin-shaped pattern spaced apart from the first fin-shaped pattern in a second direction and extending lengthwise in the first direction; a plurality of first gate electrodes extending lengthwise in the second direction, on the first fin-shaped pattern; a plurality of second gate electrodes extending lengthwise in the second direction, on the second fin-shaped pattern; a plurality of gate separation structures, each of which respectively separates a first gate electrode of the plurality of first gate electrodes and a corresponding second gate electrode of the plurality of second gate electrodes; for each first gate electrode and gate separation structure, a gate insulating film extending along a side wall of the first gate electrode and a side wall of the gate separation structure; a first source/drain pattern disposed between two adjacent first gate electrodes of the plurality of first gate electrodes and connected to the first fin-shaped pattern; a second source/drain pattern disposed between two adjacent second gate electrodes of the plurality of second gate electrodes and connected to the second fin-shaped pattern; and a first source/drain contact extending in the second direction, on the first source/drain pattern and the second source/drain pattern. The first source/drain contact includes a first lower source/drain contact region that intersects the first fin-shaped pattern and the second fin-shaped pattern, and a first upper source/drain contact region that protrudes from the first lower source/drain contact region, and the first upper source/drain contact region does not overlap at least one of the gate separation structures in the first direction.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Although the drawings of a semiconductor device according to some embodiments show a fin-shaped transistor (FinFET) including a channel region of a fin-shaped pattern shape, a transistor including a nanowire or a nanosheet, and a MBCFET™ (Multi-Bridge Channel Field Effect Transistor) as an example, the embodiments are not limited thereto. The semiconductor device according to some embodiments may, of course, include a tunneling transistor (tunneling FET) or a three-dimensional (3D) transistor. The semiconductor device according to some embodiments may, of course, include a planar transistor. In addition, the technical idea of the present invention may be applied to a transistor based on two-dimensional material (2D material based FETs) and a heterostructure thereof.

Further, the semiconductor device according to some embodiments may also include a bipolar junction transistor, a laterally diffused metal oxide semiconductor (LDMOS), or the like.

Figure 1:
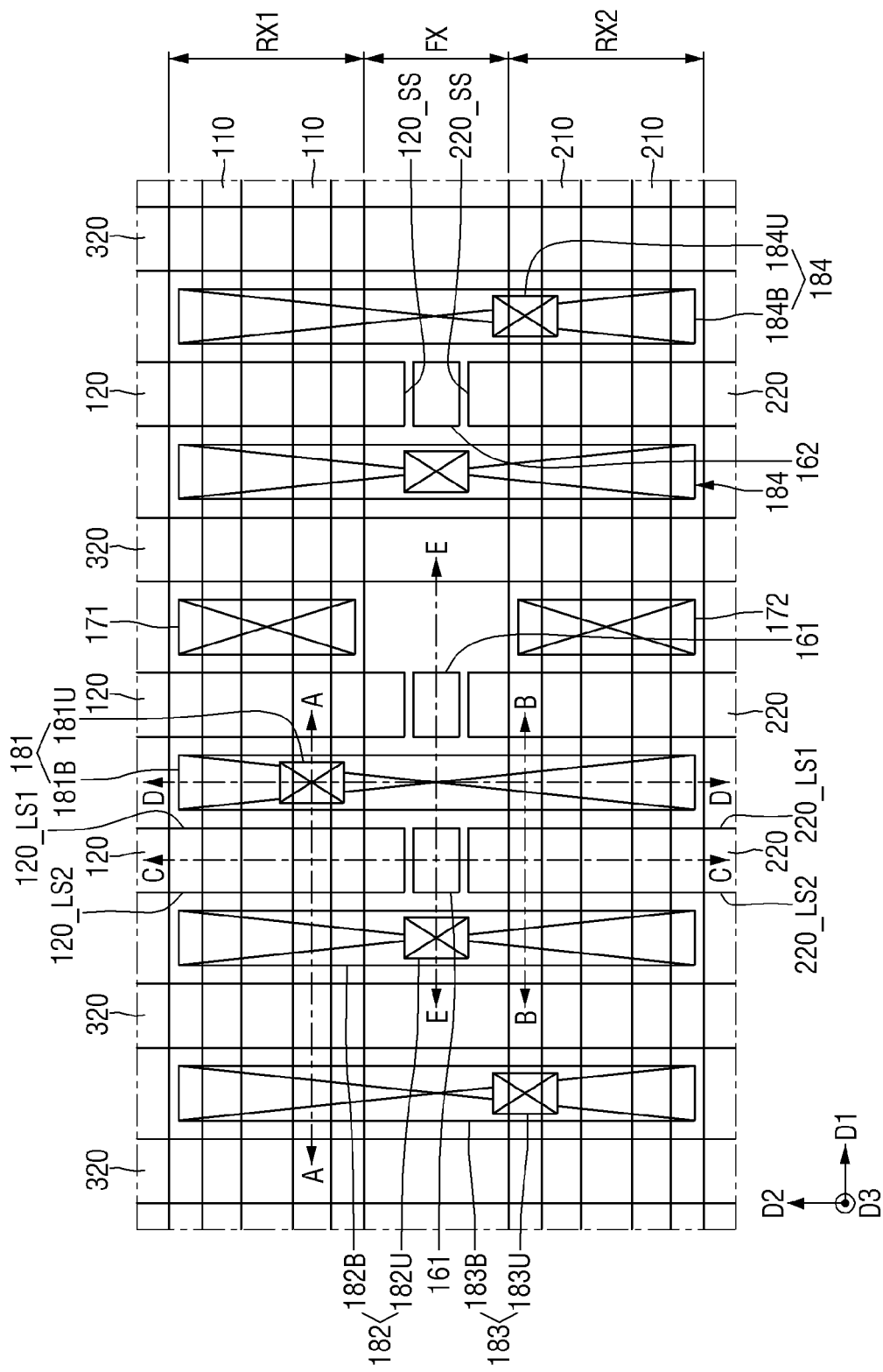
FIG. 1 is an exemplary layout diagram for explaining a semiconductor device according to some embodiments.

FIG. 1 is an exemplary layout diagram for explaining a semiconductor device according to some embodiments. FIGS. 2 to 6 are cross-sectional views taken along lines A-A, B-B, C-C, D-D and E-E of FIG. 1, respectively. For convenience of explanation, FIG. 1 does not show inter-wiring insulating films 190, 191, 192 and 193, vias 206 and 207, a wiring line 205, and the like.

Referring to FIGS. 1 to 6, the semiconductor device according to some embodiments may include a first fin-shaped pattern 110, a second fin-shaped pattern 210, first to third gate electrodes 120, 220 and 320, a first source/drain contact 171, a second source/drain contact 172, first to fourth connection source/drain contacts 181, 182, 183 and 184, a first gate separation structure 161, and a second gate separation structure 162.

The substrate 100 may be bulk silicon or an SOI (silicon-on-insulator) substrate. In contrast, the substrate 100 may be a silicon substrate or may include, but is not limited to, other materials, for example, silicon germanium, SGOI (silicon germanium on insulator), indium antimonide, lead tellurium compounds, indium arsenic, indium phosphide, gallium arsenide or gallium antimonide.

The first fin-shaped pattern 110 may be provided with the substrate 100. For example, the first fin-shaped pattern 110 may be disposed on the substrate (e.g., via epitaxial growth), or may be part of the substrate formed by etching a portion of the substrate to form the first fin-shaped pattern 110. The first fin-shaped pattern 110 may be formed in a first active region RX1 of the substrate 100. The first fin-shaped pattern 110 may extend lengthwise along a first direction D1. An item, layer, or portion of an item or layer described as extending "lengthwise" in a particular direction has a length in the particular direction and a width perpendicular to that direction, where the length is greater than the width. The first fin-shaped pattern 110 may be defined by a fin trench FT extending in the first direction D1. The fin trench FT may define a side wall of the first fin-shaped pattern 110. A plurality of first fin-shaped patterns 110 may be arranged to be parallel to each other, with each adjacent pair of first fin-shaped patterns 110 separated by a fin trench FT.

The second fin-shaped pattern 210 may be provided with the substrate 100. For example, the second fin-shaped pattern 210 may be disposed on the substrate (e.g., via epitaxial growth), or may be part of the substrate formed by etching a portion of the substrate to form the second fin-shaped pattern 210. The second fin-shaped pattern 210 may be formed in a second active region RX2. The second fin-shaped pattern 210 may extend lengthwise along the first direction D1. The second fin-shaped pattern 210 may be defined by the fin trench FT extending in the first direction D1. A plurality of second fin-shaped patterns 210 may be arranged to be parallel to each other, with each adjacent pair of second fin-shaped patterns 210 separated by a fin trench FT. The second fin-shaped pattern 210 may be separated from the first fin-shaped pattern 110 in a second direction D2. Here, the first direction D1 may intersect the second direction D2 and a third direction D3. Also, the second direction D2 may intersect the third direction D3. The third direction D3 may be a direction that is perpendicular to an upper surface of the substrate 100 (e.g., a vertical direction), and the first direction D1 and second direction D2 may be directions parallel to an upper surface of the substrate 100 (e.g., horizontal directions).

A field region FX may be disposed between the first active region RX1 and the second active region RX2. The field region FX may be defined by a deep trench DT that is deeper than a fin trench FT. The deep trench DT may define the first active region RX1 and the second active region RX2. For example, the deep trench DT may extend lengthwise in the first direction D1. The deep trench DT may be formed between the first fin-shaped pattern 110 and the second fin-shaped pattern 210. In the semiconductor device according to some embodiments, the deep trench DT may distinguish the first active region RX1 and the second active region RX2.

As an example, one of the first active region RX1 and the second active region RX2 may be an NMOS formation region, and the other thereof may be a PMOS formation region. As another example, the first active region RX1 and the second active region RX2 may be the PMOS formation region. As still another example, the first active region RX1 and the second active region RX2 may be the NMOS formation region.

Each of the first fin-shaped pattern 110 and the second fin-shaped pattern 210 may be a part of the substrate 100, or may include an epitaxial layer that is grown from the substrate 100. Each of the first fin-shaped pattern 110 and the second fin-shaped pattern 210 may include, for example, silicon or germanium which is an elemental semiconductor material. Further, each of the first fin-shaped pattern 110 and the second fin-shaped pattern 210 may be formed of or may include a compound semiconductor, and may be formed of or may include, for example, a group IV-IV compound semiconductor or a group III-V compound semiconductor.

The group IV-IV compound semiconductor may be or may include, for example, a binary compound or a ternary compound containing at least two or more of carbon (C), silicon (Si), germanium (Ge) and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element. As an example, the first fin-shaped pattern 110 and the second fin-shaped pattern 210 may include or be formed of the same material or materials as each other. As another example, the first fin-shaped pattern 110 may include a material different from the second fin-shaped pattern 210.

Although the number of first fin-shaped patterns 110 disposed in the first active region RX1 is shown as being the same as the number of second fin-shaped patterns 210 disposed in the second active region RX2, the embodiments are not limited thereto. Also, although the number of the first fin-shaped patterns 110 disposed in the first active region RX1 and the second fin-shaped patterns 210 disposed in the second active region RX2 is shown as two, the number thereof is not limited thereto. The number of first fin-shaped patterns 110 disposed in the first active region RX1 and the second fin-shaped patterns 210 disposed in the second active region RX2 may be one or three or more, respectively.

The field insulating film 105 may be disposed around the first fin-shaped pattern 110 and the second fin-shaped pattern 210, for example to surround the first fin-shaped pattern 110 and the second fin-shaped pattern 210, from a plan view. The field insulating film 105 may fill the deep trench DT. The field insulating film 105 may fill a part of the fin trench FT (e.g., a bottom part). The field insulating film 105 may be formed on a part of the side walls of the first fin-shaped pattern 110 and a part of the side walls of the second fin-shaped pattern 210. For example, the field insulating film 105 may contact part of the side walls of the first fin-shaped pattern 110 and part of the side walls of the second fin-shaped pattern 210.

The first fin-shaped pattern 110 and the second fin-shaped pattern 210 may each protrude upward from the upper surface of the respective field insulating film 105. The field insulating film 105 may include or be formed of, for example, an oxide film, a nitride film, an oxynitride film or a combination film thereof.

The first to third gate electrodes 120, 220 and 320 may each extend in the second direction D2. The first to third gate electrodes 120, 220 and 320 may each be disposed on the field insulating film 105.

The first gate electrode 120 is disposed on the first fin-shaped pattern 110 and may intersect the first fin-shaped pattern 110. The first gate electrode 120 does not intersect the second fin-shaped pattern 210. The second gate electrode 220 is disposed on the second fin-shaped pattern 210 and may intersect the second fin-shaped pattern 210. The second gate electrode 220 does not intersect the first fin-shaped pattern 110. The third gate electrode 320 is disposed on the first fin-shaped pattern 110 and the second fin-shaped pattern 210, and may intersect the first fin-shaped pattern 110 and the second fin-shaped pattern 210.

The first gate electrode 120 and the second gate electrode 220 are spaced apart from each other in the second direction D2 and may be arranged in the second direction D2. The first gate electrode 120 may be disposed to correspond to the second gate electrode 220. The third gate electrode 320 may be spaced apart from the first gate electrode 120 in the first direction D1. The third gate electrode 320 may be spaced apart from the second gate electrode 220 in the first direction D1.

The first gate electrode 120 may include a first long side wall 120_LS1 and a second long side wall 120_LS2 that are opposite to each other in the first direction D1. The first long side wall 120_LS1 of the first gate electrode and the second long side wall 120_LS2 of the first gate electrode may extend lengthwise in the second direction D2. The first long side wall 120_LS1 of the first gate electrode is a plane that is opposite to the second long side wall 120_LS2 of the first gate electrode. The first gate electrode 120 may include a short side wall 120_SS extending in the first direction D1. The second gate electrode 220 may include a first long side wall 220_LS1 and a second long side wall 220_LS2 that are opposite to each other in the first direction D1. The first long side wall 220_LS1 of the second gate electrode and the second long side wall 220_LS2 of the second gate electrode may extend lengthwise in the second direction D2. The second gate electrode 220 may include a short side wall 220_SS extending in the first direction D1. The short side wall 120_SS of the first gate electrode and the short side wall 220_SS of the second gate electrode face each other.

As an example, a plurality of first gate electrodes 120 adjacent to each other in the first direction D1 may be continuously disposed on the first fin-shaped pattern 110. Further, the plurality of second gate electrodes 220 adjacent to each other in the first direction D1 may be continuously disposed on the second fin-shaped pattern 210. As another example, the first gate electrode 120 may not be continuously disposed on the first fin-shaped pattern 110 in the first direction D1. The second gate electrode 220 may not be continuously disposed on the second fin-shaped pattern 210 in the second direction D2.

Although FIG. 1 shows that the number of the first gate electrodes 120 and the second gate electrodes 220 disposed between the third gate electrodes 320 adjacent to each other in the first direction D1 is the same, the embodiment is not limited thereto. Unlike the shown embodiment, at least one of the first gate electrodes 120 may be disposed in the second active region RX2 and may face an insulating material gate extending in the second direction D2. Alternatively, at least one of the second gate electrodes 220 may be disposed in the first active region RX1 and may face the insulating material gate extending in the second direction D2.

For example, an upper surface 120_US of the first gate electrode may include a concave curved surface. A part of the first gate electrode 120 may be removed before forming a first gate capping pattern 145 to be described below. By an etching process of removing a part of the first gate electrode 120, at least a part of the upper surface 120_US of the first gate electrode may be changed to a concave curved surface.

Figure 2:
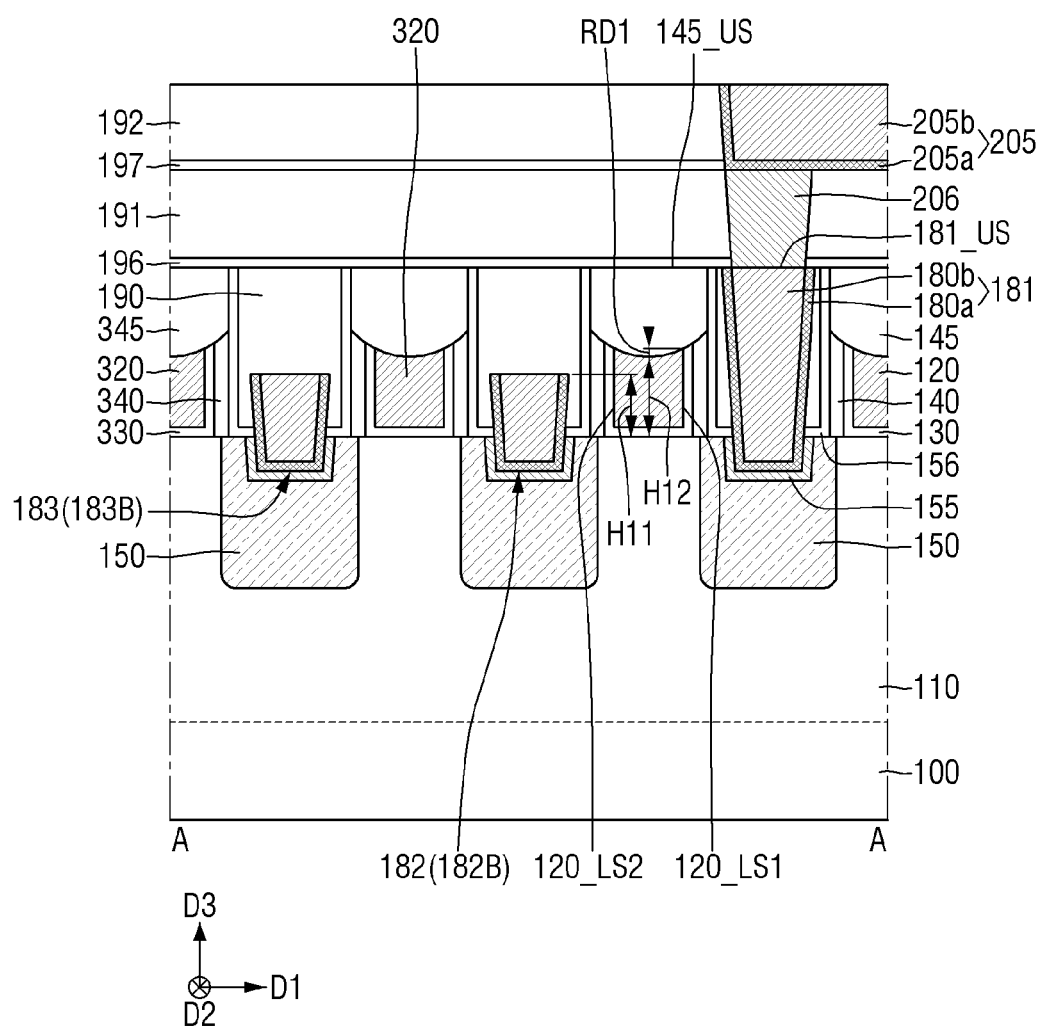
FIGS. 2 to 6 are cross-sectional views taken along lines A-A, B-B, C-C, D-D and E-E of FIG. 1, respectively.
Figure 3:
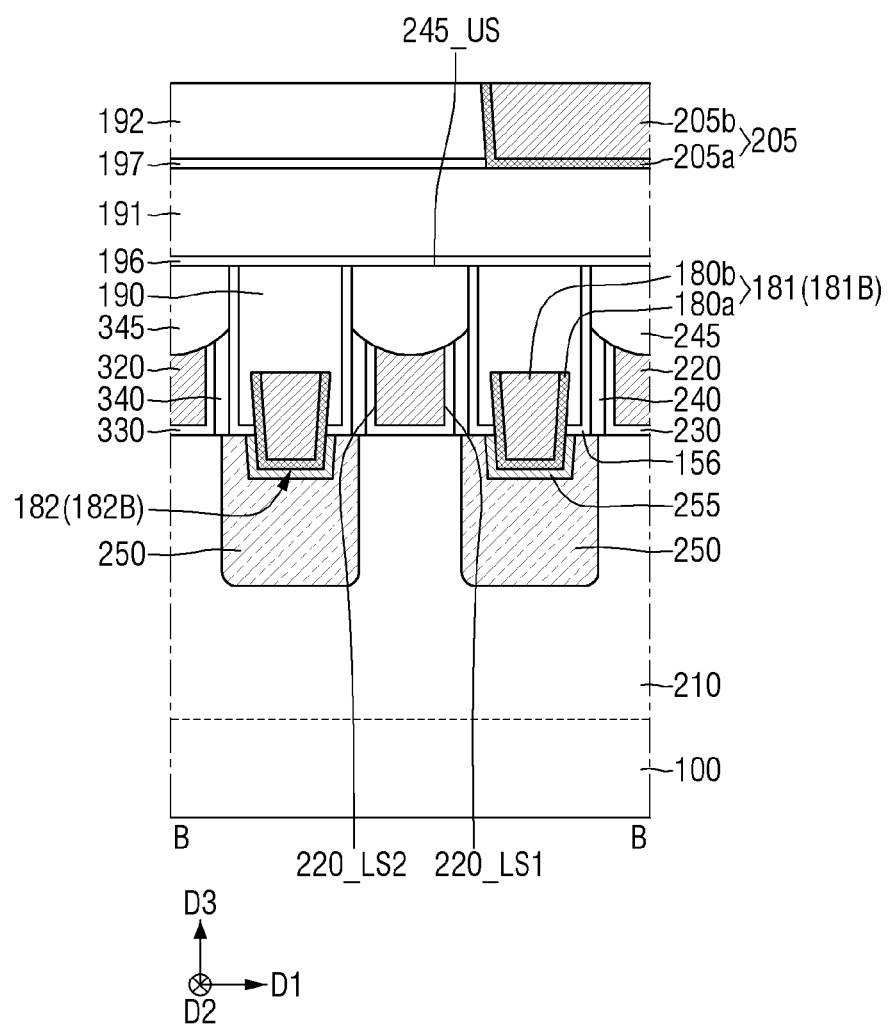

As in FIG. 2, in the cross-sectional view taken along the first fin-shaped pattern 110, the upper surface 120_US of the first gate electrode may have a first recess depth RD1. As in FIG. 4, in the cross-sectional view taken along the first gate electrode 120, the upper surface 120_US of the first gate electrode may have a second recess depth RD2. The second recess depth RD2 is greater than the first recess depth RD1.

Here, the "recess depth" may be a difference between an uppermost part of the upper surface 120_US of the first gate electrode and a lowermost part of the upper surface 120_US of the first gate electrode in the cross-sectional view taken from a particular direction (e.g., D1 or D2).

The upper surface 220 US of the second gate electrode and the upper surface of the third gate electrode 320 may also include a concave curved surface, like the upper surface 120_US of the first gate electrode.

The first to third gate electrodes 120, 220 and 320 may include or be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof.

The first to third gate electrodes 120, 220 and 320 may each include or be formed of a conductive metal oxide, a conductive metal oxynitride, and the like, and may also include an oxidized form of the above-mentioned materials.

The first gate electrode 120 and the second gate electrode 220 may be separated by the first gate separation structure 161 and the second gate separation structure 162. The first gate separation structure 161 may separate pairs of first gate electrodes 120 and the second gate electrodes 220 that are consecutively disposed in the first direction D1. The second gate separation structure 162 may separate the first gate electrode 120 and the second gate electrode 220 that are not disposed in a group of a consecutive set of first and second gate electrodes (120 and 220) in the first direction D1. The first gate electrode 120, second gate electrode 220, first gate separation structure 161, and second gate separation structure 162 may all be at the same vertical level (e.g., the same level above a bottom surface of the substrate 100).

The plurality of first gate separation structures 161 may be arranged on the field region FX in the first direction D1. The plurality of first gate separation structures 161 may be disposed on the field insulating film 105, and may contact the field insulating film 105. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Each first gate separation structure 161 may separate (e.g., physically and electrically) the first gate electrode 120 and the second gate electrode 220 corresponding to each other. Each first gate separation structure 161 may separate the first gate electrode 120 and the second gate electrode 220 arranged along a line in the second direction D2. In the semiconductor device according to some embodiments, the single first gate separation structure 161 may separate a pair of first gate electrodes 120 and second gate electrodes 220.

For example, the plurality of first gate electrodes 120 may include a first_1 gate electrode and a first_2 gate electrode that are consecutively disposed in the first direction D1. The plurality of second gate electrodes 220 may include a second_1 gate electrode and a second_2 gate electrode that are consecutively disposed in the first direction D1. The plurality of gate separation structures 161 may include a first_1 gate separation structure and a first_2 gate separation structure spaced apart from each other in the first direction D1. The first_1 gate electrode and the second_1 gate electrode may be arranged in the second direction D2. The first_1 gate electrode and the second_1 gate electrode may be separated by the first_1 gate separation structure. The first_2 gate electrode and the second_2 gate electrode may be arranged in the second direction D2. The first_2 gate electrode and the second_2 gate electrode may be separated by the first_2 gate separation structure.

The second gate separation structure 162 is disposed on the field region FX. The second gate separation structure 162 may be disposed on the field insulating film 105. The second gate separation structure 162 may separate the first gate electrode 120 and the second gate electrode 220 corresponding to each other. The second gate separation structure 162 may separate the first gate electrode 120 and the second gate electrode 220 arranged in the second direction D2.

The first gate separation structure 161 and the second gate separation structure 162 may each include or be formed of, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the first gate separation structure 161 is shown as a single film, the embodiment is not limited thereto. Although not shown, the second gate separation structure 162 may have the same structure as the first gate separation structure 161.

Figure 6:
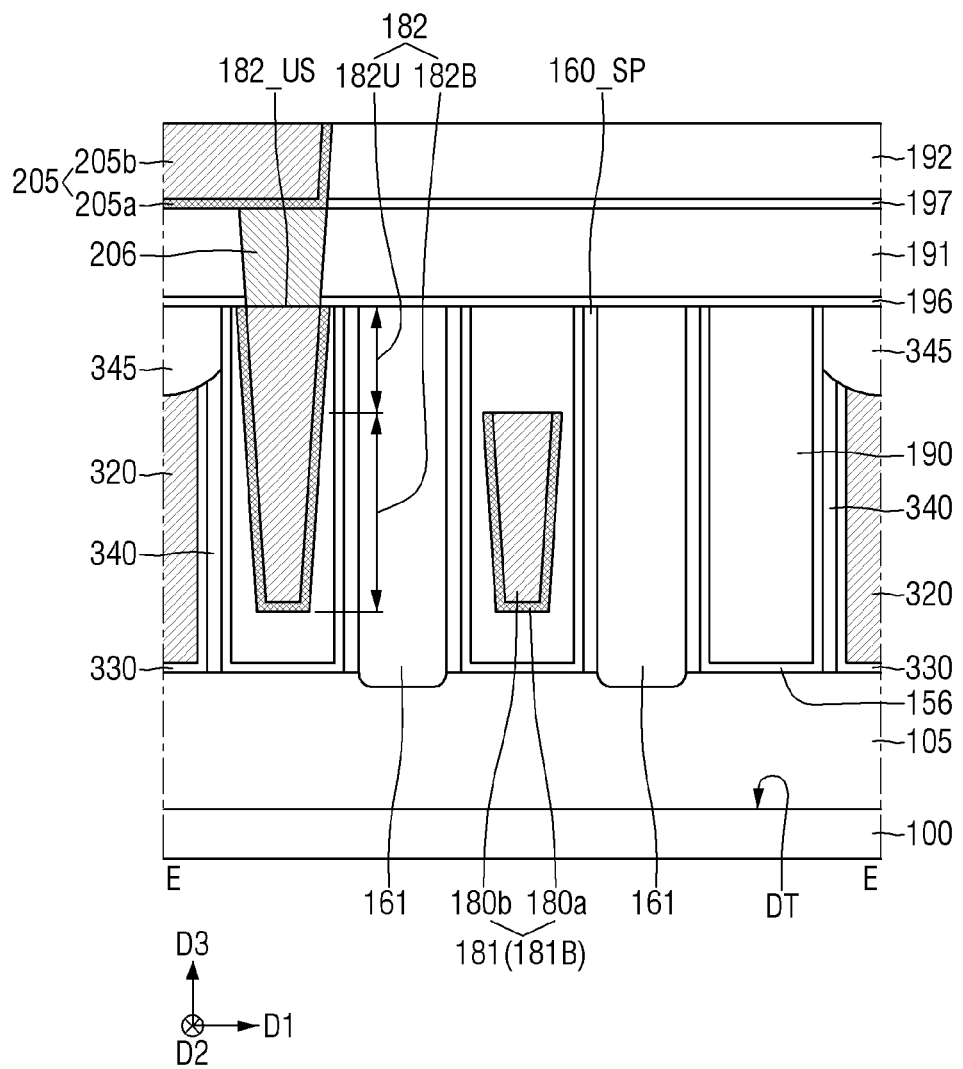

Although FIG. 6 shows that the first gate separation structure 161 penetrates into the field insulating film 105, the embodiments are not limited thereto.

The gate separation spacer 160_SP may be disposed on the side wall (e.g., on opposite sidewalls) of the first gate separation structure 161. Although not shown, the gate separation spacer 160_SP may also be disposed on the side wall of the second gate separation structure 162. The gate separation spacer 160_SP may be directly connected to a first gate spacer 140 and a second gate spacer 240 to be described below. The gate separation spacer 160_SP may include or may be formed of the same material as the first gate spacer 140 and the second gate spacer 240.

Although the first gate electrode 120 separated by the first gate separation structure 161 and the first gate electrode 120 separated by the second gate separation structure 162 are shown to intersect the first fin-shaped pattern 110, the embodiment is not limited thereto. Unlike the shown embodiment, the first gate electrode 120 separated by the first gate separation structure 161 may intersect the first fin-shaped pattern 110, but the first gate electrode 120 separated by the second gate separation structure 162 may not intersect the first fin-shaped pattern 110. For example, the first gate electrode 120 separated by the second gate separation structure 162 may intersect another fin-shaped pattern separated from the first fin-shaped pattern 110.

The first gate spacer 140 may be disposed on the long side walls 120_LS1 and 120_LS2 of the first gate electrode. The second gate spacer 240 may be disposed on the long side walls 220_LS1 and 220_LS2 of the second gate electrode. The third gate spacer 340 may be disposed on the side wall of the third gate electrode 320. The third gate spacer 340 may extend along the second direction D2. The first to third gate spacers 140, 240 and 340 may include or be formed of, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The first gate insulating film 130 may extend along the side walls, end walls, and bottom surface of the first gate electrode 120. The first gate insulating film 130 may be disposed between the first gate electrode 120 and the first fin-shaped pattern 110, and may also be disposed between the first gate electrode 120 and the first gate separation structure 161. The second gate insulating film 230 may extend along the side walls, end walls, and the bottom surface of the second gate electrode 220. The second gate insulating film 230 may be disposed between the second gate electrode 220 and the second fin-shaped pattern 210 and may also be disposed between the second gate electrode 220 and the first gate separation structure 161. The third gate insulating film 330 may extend along the side walls and a bottom surface of the third gate electrode 320. The third gate insulating film 330 may be disposed between the third gate electrode 320 and the first fin-shaped pattern 110, and between the third gate electrode 320 and the second fin-shaped pattern 210.

The first gate insulating film 130 may be formed along the profile of the first fin-shaped pattern 110 (or a set of consecutive first fin-shaped patterns 110) protruding upward from the field insulating film 105, and the upper surface of the field insulating film 105. The second gate insulating film 230 may be formed along the profile of the second fin-shaped pattern 210 (or a set of consecutive first fin-shaped patterns 110) protruding upward from the field insulating film 105 and the upper surface of the field insulating film 105. Although not shown, the third gate insulating film 330 may be formed along a profile of the first and second fin-shaped patterns 110 and 210 protruding upward from the field insulating film 105, and the upper surface of the field insulating film 105. Further, although not shown, taking the first gate insulating film 130 as an example, the first gate insulating film 130 may include an interface film along the profile of the first fin-shaped pattern 110 protruding upward from the field insulating film 105. For example, the interface film may include, but is not limited to, silicon oxide.

The first gate insulating film 130 may extend along the side wall 120_SS of the first gate electrode and the side wall 161_SW of the first gate separation structure that face each other in the second direction D2. The second gate insulating film 230 may extend along the side wall 220_SS of the second gate electrode and the side wall 161_SW of the first gate separation structure that face each other in the second direction D2.

The first to third gate insulating films 130, 230 and 330 may include or be formed of an insulating material such as silicon oxide, silicon oxynitride, silicon nitride, or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some other embodiments may include an NC (Negative Capacitance) FET that uses a negative capacitor. For example, the first to third gate insulating films 130, 230 and 330 may each include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the entire capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include or may be, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include or may be, for example, at least one of gadolinium (Gd), silicon (Si), zirconium (Zr), aluminum (Al), and yttrium (Y).

When the dopant is aluminum (Al), the ferroelectric material film may include or may be 3 to 8 at % (atomic %) aluminum. Here, a ratio of the dopant may be a ratio of aluminum to the sum of hafnium and aluminum.

When the dopant is silicon (Si), the ferroelectric material film may include or may be 2 to 10 at % silicon. When the dopant is yttrium (Y), the ferroelectric material film may include or may be 2 to 10 at % yttrium. When the dopant is gadolinium (Gd), the ferroelectric material film may include or may be 1 to 7 at % gadolinium. When the dopant is zirconium (Zr), the ferroelectric material film may include or may be 50 to 80 at % zirconium.

The paraelectric material film may have paraelectric properties. The paraelectric material film may include or may be at least one of, for example, a silicon oxide and a metal oxide having a high dielectric constant. The metal oxide included in the paraelectric material film may include or may be, for example, but is not limited to, at least one of hafnium oxide, zirconium oxide, and aluminum oxide.

The ferroelectric material film and the paraelectric material film may include or may be the same material. The ferroelectric material film has the ferroelectric properties, but the paraelectric material film may not have the ferroelectric properties. For example, when the ferroelectric material film and the paraelectric material film are both hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, each of the first to third gate insulating films 130, 230 and 330 may include one ferroelectric material film. As another example, the first to third gate insulating films 130, 230 and 330 may each include a plurality of ferroelectric material films spaced apart from each other. The first to third gate insulating films 130, 230 and 330 may each have a stacked film structure in which a plurality of ferroelectric material films and a plurality of paraelectric material films are alternately stacked.

The first to third gate capping patterns 145, 245 and 345 may be disposed on the first to third gate electrodes 120, 220 and 320. Further, the first to third gate capping patterns 145, 245 and 345 may be disposed on the upper surface of the first to third gate spacers 140, 240 and 340. The first to third gate capping patterns 145, 245 and 345 may include or be formed of, for example, at least one of silicon nitride (SiN), silicon oxynitride (SiON), silicon oxide ($SiO_2$), silicon carbonitride (SiCN), silicon oxycarbonitride (SiOCN), and combinations thereof.

Unlike the shown embodiment, the first to third gate capping patterns 145, 245 and 345 may each be disposed between the first to third gate spacers 140, 240 and 340. In such a case, taking the first gate capping pattern 145 as an example, an upper surface 145 US of the first gate capping pattern 145 may be disposed on the same plane as the upper surface of the first gate spacer 140.

A first source/drain pattern 150 may be disposed on the first fin-shaped pattern 110. The first source/drain pattern 150 may be disposed between the first gate electrodes 120 adjacent to each other in the first direction D1, or between the first gate electrode 120 and the third gate electrode 320. The first source/drain pattern 150 may be connected to the first fin-shaped pattern 110 (or a plurality of first fin-shaped patterns 110). The first source/drain pattern 150 may be disposed in the first active region RX1.

A second source/drain pattern 250 may be disposed on the second fin-shaped pattern 210. The second source/drain pattern 250 may be disposed between the second gate electrodes 220 adjacent to each other in the first direction D1, or between the second gate electrode 220 and the third gate electrode 320. The second source/drain pattern 250 may be connected to the second fin-shaped pattern 210 (or a plurality of second fin-shaped patterns 210). The second source/drain pattern 250 may be disposed in the second active region RX2. The second source/drain pattern 250 is separated from the first source/drain pattern 150 in the second direction D2. For example, in one embodiment, second source/drain pattern 250 is not directly connected to the first source/drain pattern 150.

The first source/drain pattern 150 is connected to a plurality of first fin-shaped patterns 110, and the second source/drain pattern 250 is connected to a plurality of second fin-shaped patterns 210. Therefore, the first source/drain pattern 150 and the second source/drain pattern 250 may each be a shared epitaxial pattern. As an example, an air gap may be disposed in a space within the first source/drain patterns 150 where they join with the field insulating film 105. As another example, an insulating material may be filled in the space within the first source/drain patterns 150 where they join with the field insulating film 105.

The first source/drain pattern 150 and the second source/drain pattern 250 may be included in a source/drain of a transistor that uses the first fin-shaped pattern 110 and the second fin-shaped pattern 210 as channel regions, respectively.

A lower etching stop film 156 may be disposed on the side walls of the first to third gate electrodes 120, 220 and 320 and on the first and second source/drain patterns 150 and 250. The lower etching stop film 156 may include or may be a material having an etching selectivity with respect to a lower interlayer insulating film 190 to be described below. The lower etching stop film 156 may include or may be, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The lower interlayer insulating film 190 may be disposed on the lower etching stop film 156. The lower interlayer insulating film 190 may not cover the upper surfaces of the first to third gate capping patterns 145, 245 and 345. For example, the upper surface of the lower interlayer insulating film 190 may be disposed on the same plane as the upper surface 145 US of the first gate capping pattern, the upper surface 245 US of the second gate capping pattern, and the upper surface of the third gate capping pattern 345.

The lower interlayer insulating film 190 may include or may be formed of, for example, at least one of silicon oxide, silicon nitride, silicon oxynitride, and a low dielectric constant material. The low dielectric constant material may include or may be formed of, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDi Siloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

First to fourth connection source/drain contacts 181, 182, 183 and 184 may be disposed on the first source/drain pattern 150 and the second source/drain pattern 250, respectively. The first to fourth connection source/drain contacts 181, 182, 183 and 184 may be disposed on the first fin-shaped pattern 110 and the second fin-shaped pattern 210, respectively. The first to fourth connection source/drain contacts 181, 182, 183 and 184 may each be connected to the source/drain pattern 150 and the second source/drain pattern 250 at the same time. The first to fourth connection source/drain contacts 181, 182, 183 and 184 may each extend in the second direction D2.

The first source/drain contact 171 may be disposed on the first source/drain pattern 150 over the first fin-shaped pattern 110. The second source/drain contact 172 may be disposed on the second source/drain pattern 250 over the second fin-shaped pattern 210. The first source/drain contact 171 is electrically connected to the first source/drain pattern 150, but is not electrically connected to the second source/drain pattern 250. The second source/drain contact 172 is electrically connected to the second source/drain pattern 250, but is not electrically connected to the first source/drain pattern 150. The following description will focus on the first to fourth connection source/drain contacts 181, 182, 183 and 184.

The first to fourth connection source/drain contacts 181, 182, 183 and 184 and the first and second source/drain contacts 171 and 172 may each be disposed in the lower interlayer insulating film 190.

A first silicide film 155 may be formed between the connection source/drain contacts 181, 182, 183 and 184 and the first source/drain pattern 150, and between the first source/drain contact 171 and the first source/drain pattern 150. A second silicide film 255 may be formed between the connection source/drain contacts 181, 182, 183 and 184 and the second source/drain pattern 250, and between the second source/drain contacts 172 and second source/drain pattern 250. The first silicide film 155 and the second silicide film 255 may each include or may be, for example, a metal silicide material.

A first connection source/drain contact 181 may be disposed between the first gate electrodes 120, and between the second gate electrodes 220. The first gate separation structure 161 may be disposed on both sides (e.g., opposite sides) of the first connection source/drain contact 181.

For example, the plurality of first gate electrodes 120 include a first_1 gate electrode and a first_2 gate electrode which are consecutively disposed in the first direction D1, and the plurality of second gate electrodes 220 may include a second_1 gate electrode and a second_2 gate electrode which are disposed consecutively in the first direction D1. The first connection source/drain contact 181 may be disposed between the first_1 gate electrode and the first_2 gate electrode, and between the second_1 gate electrode and the second_2 gate electrode. Also, when the plurality of gate separation structures 161 include the first_1 gate separation structure and the first_2 gate separation structure spaced apart from each other in the first direction D1, the first connection source/drain contact 181 may be disposed between the first_1 gate separation structure and the first_2 gate separation structure.

The second connection source/drain contact 182 is adjacent to the first connection source/drain contact 181 in the first direction D1. The first gate electrode 120 and the second gate electrode 220 arranged in the second direction D2 may be disposed on one side of the second connection source/drain contact 182. However, the first gate electrode 120 and the second gate electrode 220 arranged in the second direction D2 may not be disposed on the other side (e.g., an opposite side) of the second connection source/drain contact 182. That is, the second connection source/drain contact 182 is not disposed between the first gate electrodes 120, and between the second gate electrodes 220. The first gate separation structure 161 is disposed on one side of the second connection source/drain contact 182, but the first gate separation structure 161 is not disposed on the other side of the second connection source/drain contact 182.

For example, the second connection source/drain contact 182 may be disposed between the first gate electrode 120 and the third gate electrode 320, and between the second gate electrode 220 and the third gate electrode 320.

The single first gate electrode 120 and the single second gate electrode 220 may be disposed between the first connection source/drain contact 181 and the second connection source/drain contact 182. Further, the single first gate separation structure 161 may be disposed between the first connection source/drain contact 181 and the second connection source/drain contact 182.

Although an embodiment is shown in which the second connection source/drain contact 182 is disposed on one side of the first connection source/drain contact 181, and the first source/drain contact 171 and the second source/drain contact 172 are disposed on the other side of the first connection source/drain contact 181, the embodiments are not limited thereto. Unlike the shown embodiment, the second connection source/drain contact 182 may, of course, be disposed on the other side of the first connection source/drain contact 181.

The first gate electrode 120 and the second gate electrode 220 arranged in the second direction D2 are not disposed on one side and the other side of the third connection source/drain contact 183. For example, the third connection source/drain contact 183 may be disposed between the third gate electrodes 320.

The first gate electrode 120 and the second gate electrode 220 arranged in the second direction D2 may be disposed on one side of a fourth connection source/drain contact 184. However, the first gate electrode 120 and the second gate electrode 220 arranged in the second direction D2 may not be disposed on the other side of the fourth connection source/drain contact 184. For example, in this embodiment, the fourth connection source/drain contact 184 is not disposed between the first gate electrodes 120, and between the second gate electrodes 220. The second gate separation structure 162 is disposed on one side of the fourth connection source/drain contact 184, but the second gate separation structure 162 is not disposed on the other side of the fourth connection source/drain contact 184. When the fourth connection source/drain contacts 184 are disposed to be adjacent to each other in the first direction D1, the single first gate electrode 120 and the single second gate electrode 220 may be disposed between the fourth connection source/drain contacts 184. Further, the single second gate separation structure 162 may be disposed between the fourth connection source/drain contacts 184.

For example, the fourth connection source/drain contact 184 may be disposed between the first gate electrode 120 and the third gate electrode 320, and between the second gate electrode 220 and the third gate electrode 320.

The first connection source/drain contact 181 may include a first lower source/drain contact region 181B and a first upper source/drain contact region 181U. The second connection source/drain contact 182 may include a second lower source/drain contact region 182B and a second upper source/drain contact region 182U. The third connection source/drain contact 183 may include a third lower source/drain contact region 183B and a third upper source/drain contact region 183U. The fourth connection source/drain contact 184 may include a fourth lower source/drain contact region 184B and a fourth upper source/drain contact region 184U.

The first to fourth upper source/drain contact regions 181U, 182U, 183U and 184U each protrude from the first to fourth lower source/drain contact regions 181B, 182B, 183B and 184B in the third direction D3. The first to fourth lower source/drain contact regions 181B, 182B, 183B and 184B may intersect the first fin-shaped pattern 110 and the second fin-shaped pattern 210.

The first to fourth upper source/drain contact regions 181U, 182U, 183U and 184U may be portions on which a source/drain via 206 to be described below is landed. The first to fourth connection source/drain contacts 181, 182, 183 and 184 may be connected to the wiring line 205 through the first to fourth upper source/drain contact regions 181U, 182U, 183U and 184U.

Figure 5:
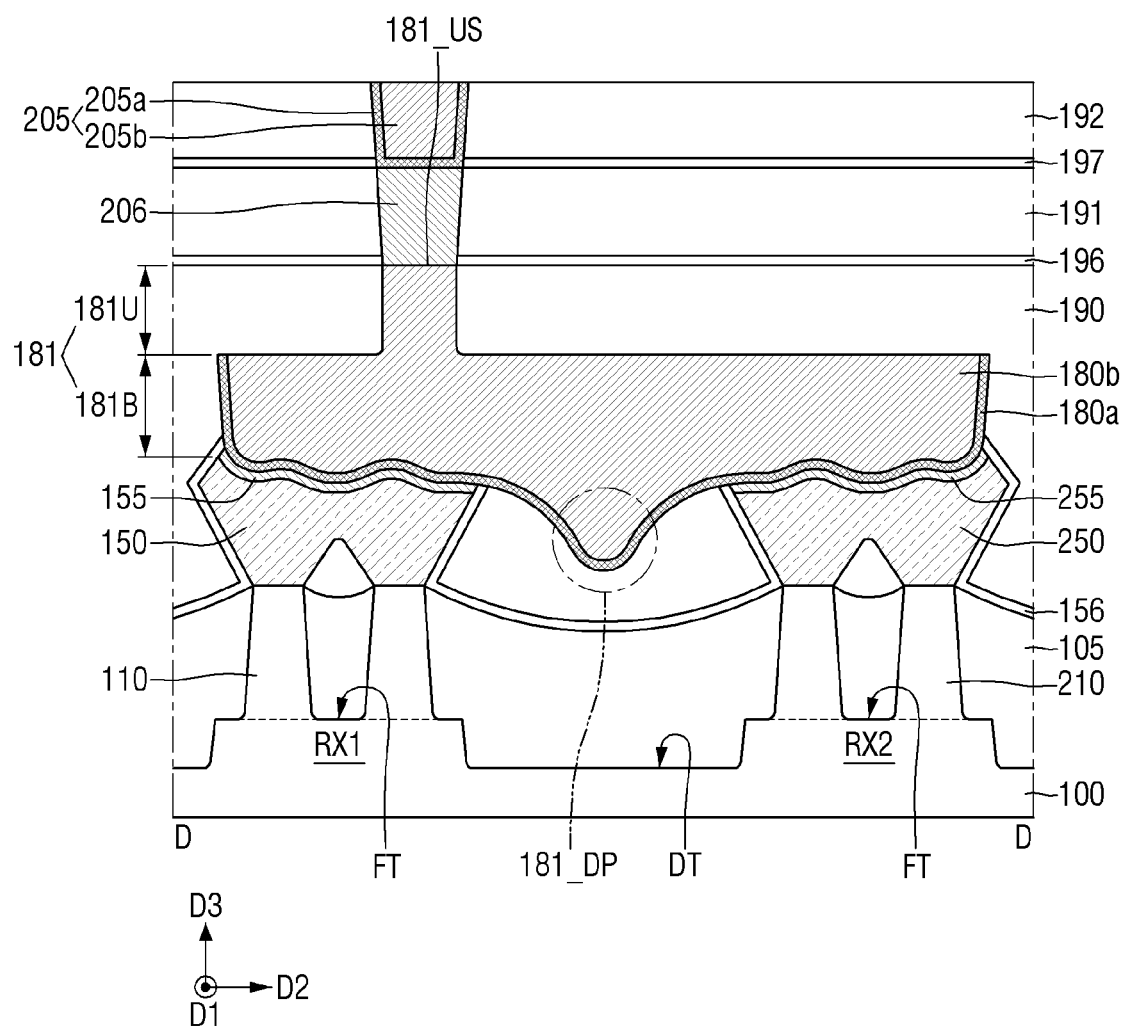

In FIG. 5, the first lower source/drain contact region 181B is simultaneously and continuously connected to the first source/drain pattern 150 and the second source/drain pattern 250. Although not shown, the second to fourth lower source/drain contact regions 182B, 183B and 184B are also each simultaneously and continuously connected to the first source/drain pattern 150 and the second source/drain pattern 250.

The first lower source/drain contact region 181B may be directly connected to the first upper source/drain contact region 181U. The first lower source/drain contact region 181B and the first upper source/drain contact region 181U may have an integral, continuous structure. In view of the manufacturing process, after forming a pre-structure of the first connection source/drain contact 181, a part of the pre-structure may be removed. An upper surface of the pre-structure of the first connection source/drain contact 181 may be disposed on the same plane as the upper surface of the lower interlayer insulating film 190. By removing a part of the pre-structure, the first lower source/drain contact region 181B and the first upper source/drain contact region 181U may be formed. Since a part of the pre-structure of the first connection source/drain contact 181 is etched to form the first upper source/drain contact region 181U, there may be no boundary line (e.g., no grain boundary) by which the first lower source/drain contact region 181B and the first upper source/drain contact region 181U are divided.

Although FIG. 5 shows that the first connection source/drain contact 181 has a shape similar to "T" rotated by 180 degrees, the embodiment is not limited thereto. Depending on the position of the first upper source/drain contact region 181U, the first connection source/drain contact 181 may also have a shape similar to "L". Although not shown, the second to fourth connection source/drain contacts 182, 183 and 184 may also have a shape similar to "T" or "L" rotated by 180 degree.

Cross-sections of the first and second source/drain contacts 171 and 172 may also have a shape similar to "T" or "L". Alternatively, the cross-sections of the first and second source/drain contacts 171 and 172 may have a trapezoidal shape in which a width in the second direction D2 gradually increases as it goes away from the substrate 100.

The uppermost surface of the first connection source/drain contact 181 may be the upper surface 181_US of the first upper source/drain contact region. The uppermost surface of the second connection source/drain contact 182 may be the upper surface 182_US of the second upper source/drain contact region. The upper surface 181_US of the first upper source/drain contact region and the upper surface 182_US of the second upper source/drain contact region may be disposed on the same plane as the upper surface of the lower interlayer insulating film 190. Further, the upper surface 181_US of the first upper source/drain contact region and the uppermost surface 182_US of the second upper source/drain contact region may be disposed on the same plane as at least a part of the upper surface 145 US of the first gate capping pattern. The upper surface 181_US of the first upper source/drain contact region and the upper surface 182_US of the second upper source/drain contact region may be disposed on the same plane as the upper surface 245 US of the second gate capping pattern and the upper surface of the third gate capping pattern 345. The description of the upper surfaces of the third and fourth upper source/drain contact regions 183U and 184U may be substantially the same as the description of the upper surface 181_US of the first upper source/drain contact region.

The first lower source/drain contact region 181B may include a downward protruding region 181_DP that protrudes toward the substrate 100, between the first source/drain pattern 150 and the second source/drain pattern 250. Unlike the shown embodiment, the downward protruding region 181_DP may contact the lower etching stop film 156 or the field insulating film 105. Although not shown, the second to fourth lower source/drain contact regions 182B, 183B, and 184B may also include downward protruding regions, like the first lower source/drain contact region 181B.

Figure 4:
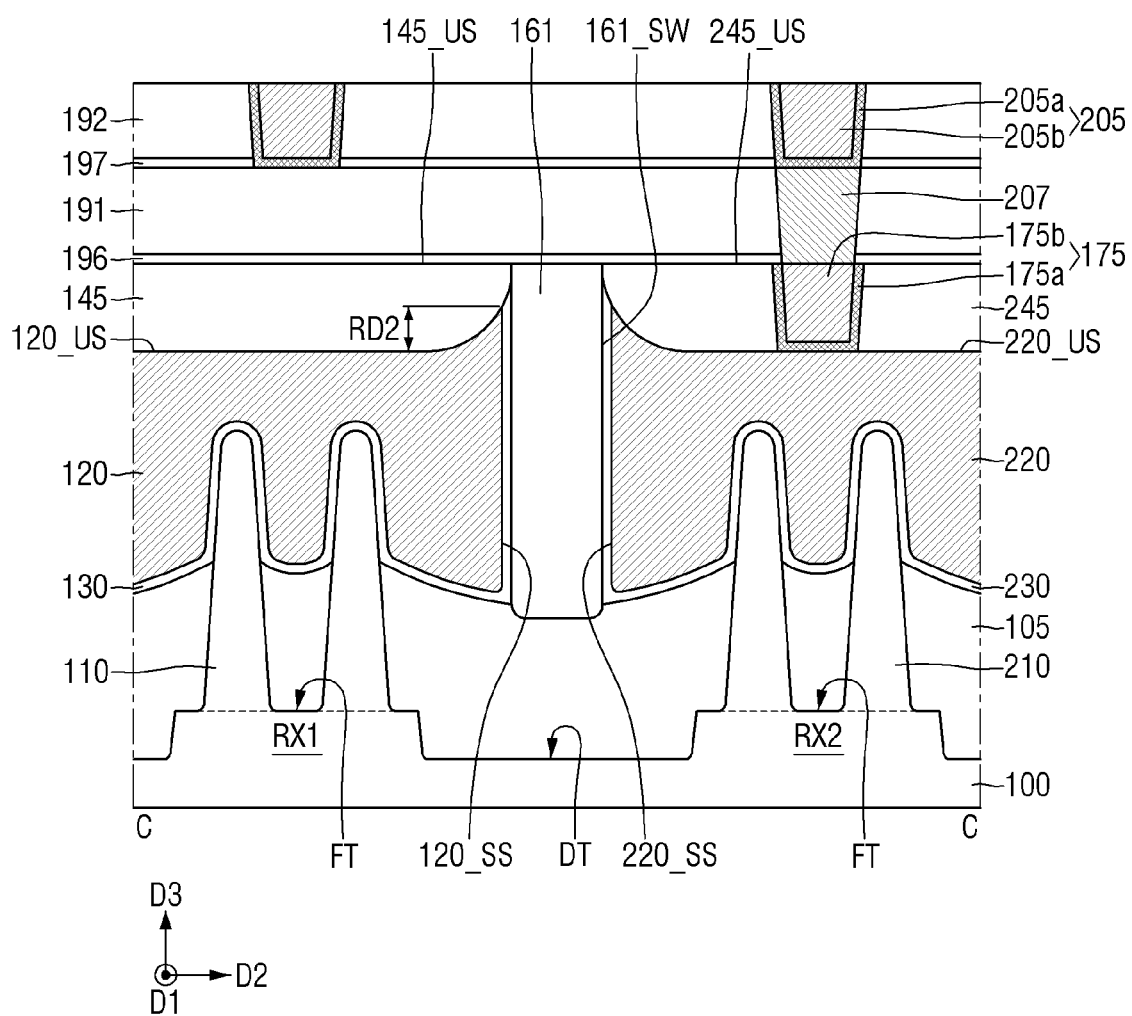

For example, in one embodiment, the first upper source/drain contact region 181U does not overlap the first gate separation structure 161 in the first direction D1. In FIG. 4, as the upper surface 120_US of the first gate electrode and the upper surface 220 US of the second gate electrode approach the first gate separation structure 161, the upper surface 120_US of the first gate electrode and the upper surface 220 US of the second gate electrode become higher. As mentioned above, the first gate electrode 120 and the second gate electrode 220 of the portion adjacent to the first gate separation structure 161 may be exposed, while the etching process is performed to form the first upper source/drain contact region 181U. When the first upper source/drain contact region 181U is disposed in the portion in which the first gate electrode 120 and the second gate electrode 220 are exposed, that is, at a position where it overlaps the first gate separation structure 161 in the first direction D1, the source/drain via 206 landed on the first upper source/drain contact region 181U may be connected to the exposed first gate electrode 120 and/or second gate electrode 220. Therefore, the first upper source/drain contact region 181U may be disposed at a position where it does not overlap the first gate separation structure 161 in the first direction D1.

In the semiconductor device according to some embodiments, the second upper source/drain contact region 182U may overlap the first gate separation structure 161 in the first direction D1. When the fourth connection source/drain contact 184 is disposed on either side of the second gate separation structure 162, one of the fourth upper source/drain contact regions 184U may overlap the second gate separation structure 162 in the first direction D1. The other of the fourth upper source/drain contact region 184U may not overlap the second gate separation structure 162 in the first direction D1.

The first to fourth connection source/drain contacts 181, 182, 183 and 184 and the first and second source/drain contacts 171 and 172 may each include a source/drain barrier film 180a and a source/drain filling film 180b.

A gate contact 175 may be disposed on the second gate electrode 220. The gate contact 175 may penetrate the second gate capping pattern 245 and be connected to the second gate electrode 120. Although not shown, the gate contact 175 may also be disposed on the first gate electrode 120 and the third gate electrode 320.

The gate contact 175 may include a gate barrier film 175a and a gate filling film 175b.

Although a boundary between the first connection source/drain contact 181 and the first source/drain pattern 150, and a boundary between the first connection source/drain contact 181 and the second source/drain pattern 250 is shown to have a wavy shape, the embodiment is not limited thereto.

A height H12 from the upper surface of the first fin-shaped pattern 110 to the upper surface 120_US of the first gate electrode (e.g., any part of the upper surface 120_US of the first gate electrode) may be greater than a height H11 from the upper surface of the first fin-shaped pattern 110 to the upper surfaces of the lower source/drain contact regions 181B, 182B, 183B and 184B. In the upper surface 120_US of the first gate electrode having a concave shape, the height of the upper surface 120_US of the first gate electrode may be a portion that is closest to the upper surface of the first fin-shaped pattern 110.

The source/drain barrier film 180a and the gate barrier film 175a may each include or be formed of, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. In the semiconductor device according to some embodiments, the two-dimensional material may be a metallic material and/or a semiconductor material. The two-dimensional (2D material) may include or may be a two-dimensional allotrope or a two-dimensional compound, and may include or may be, but is not limited to, for example, at least one of graphene, molybdenum disulfide ($MoS_2$), molybdenum diselenide ($MoSe_2$), tungsten diselenide ($WSe_2$), and tungsten disulfide ($WS_2$). Since the above-mentioned two-dimensional materials are only listed by way of example, the two-dimensional materials that may be included in the semiconductor device of the present invention are not limited by the above-mentioned materials.

The source/drain filling film 180b and the gate filing film 175b may include or may be, for example, at least one of aluminum (Al), tungsten (W), cobalt (Co), ruthenium (Ru), copper (Cu), silver (Ag), gold (Au), manganese (Mn), and molybdenum (Mo).

A first etching stop film 196 and a first upper interlayer insulating film 191 may be sequentially disposed on the first to fourth connection source/drain contacts 181, 182, 183 and 184. The first etching stop film 196 and the first upper interlayer insulating film 191 may be disposed on the lower interlayer insulating film 190.

The first etching stop film 196 may include or be formed of a material having an etching selectivity with respect to the first upper interlayer insulating film 191. The first etching stop film 196 may include or be formed of, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), aluminum oxide (AlO), aluminum nitride (AlN), aluminum oxycarbide (AlOC), and combinations thereof. Unlike the shown embodiment, the first etching stop film 196 may not be formed. The first upper interlayer insulating film 191 may include or be formed of, for example, at least one of silicon oxide, silicon nitride, silicon oxynitride and a low dielectric constant material.

The source/drain via 206 and the gate via 207 may be disposed inside the first etching stop film 196 and the first upper interlayer insulating film 191, respectively. The source/drain via 206 penetrates the first etching stop film 196 and the first upper interlayer insulating film 191, and may be connected to the first to fourth connection source/drain contacts 181, 182, 183 and 184, and the first and second source/drain contacts 171 and 172. The gate via 207 penetrates the first etching stop film 196 and the first upper interlayer insulating film 191, and may be connected to the gate contact 175.

The source/drain via 206 and the gate via 207 may each have a single film structure. The source/drain via 206 and the gate via 207 may each have a structure formed by a single film. For example, the source/drain via 206 and the gate via 207 may have a single conductive film structure. The source/drain via 206 and the gate via 207 may include or may be formed of, for example, at least one of aluminum (Al), tungsten (W), cobalt (Co), ruthenium (Ru), silver (Ag), gold (Au), manganese (Mn), and molybdenum (Mo).

Unlike the shown embodiment, in one example, one of the source/drain via 206 and the gate via 207 has a single film structure, and the other of the source/drain via 206 and the gate via 207 may have a multi-film structure (e.g., a combination of a barrier film and a filling film), such as a gate contact 175. As another example, the source/drain via 206 and the gate via 207 may each have a multi-film structure.

A second etching stop film 197 and a second upper interlayer insulating film 192 may be sequentially disposed on the first upper interlayer insulating film 191. Unlike the shown embodiment, the second etching stop film 197 may not be formed. The description of the materials of the second etching stop film 197 and the second upper interlayer insulating film 192 may be the same as that of the first etching stop film 196 and the first upper interlayer insulating film 191.

The wiring line 205 may be disposed in the second upper interlayer insulating film 192 and the second etching stop film 197. The wiring line 205 may be connected to the source/drain via 206 and the gate via 207. At least a part of the wiring line 205 may extend lengthwise in the first direction D1.

The wiring line 205 may include a wiring barrier film 205a and a wiring filling film 205b. The wiring barrier film 205a may include or may be, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. The wiring filling film 205b may include or may be, for example, at least one of aluminum (Al), copper (Cu), tungsten (W), cobalt (Co), ruthenium (Ru), silver (Ag), gold (Au), manganese (Mn), and molybdenum (Mo).

Figure 7:
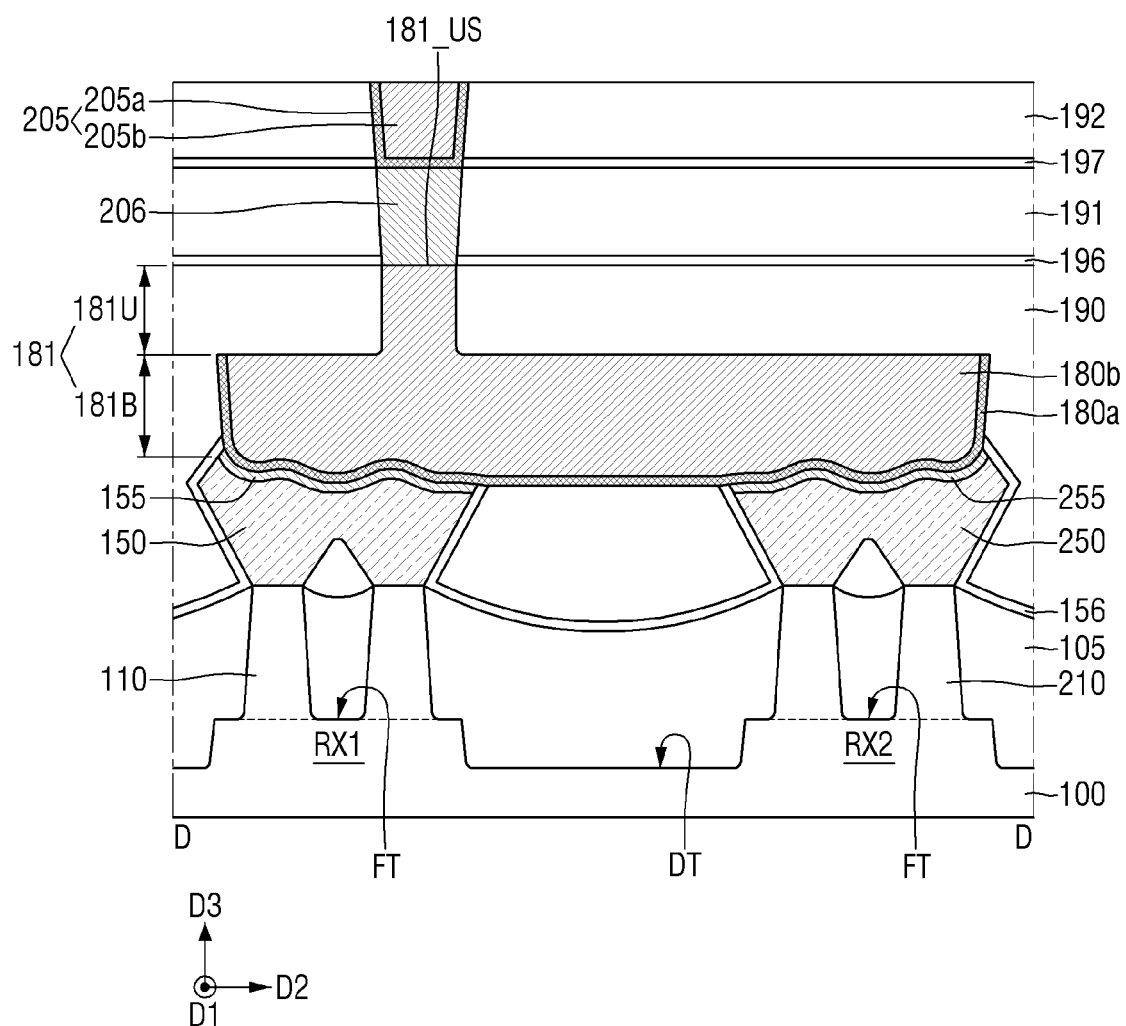
FIG. 7 is a diagram for explaining the semiconductor device according to some embodiments.
Figure 8:
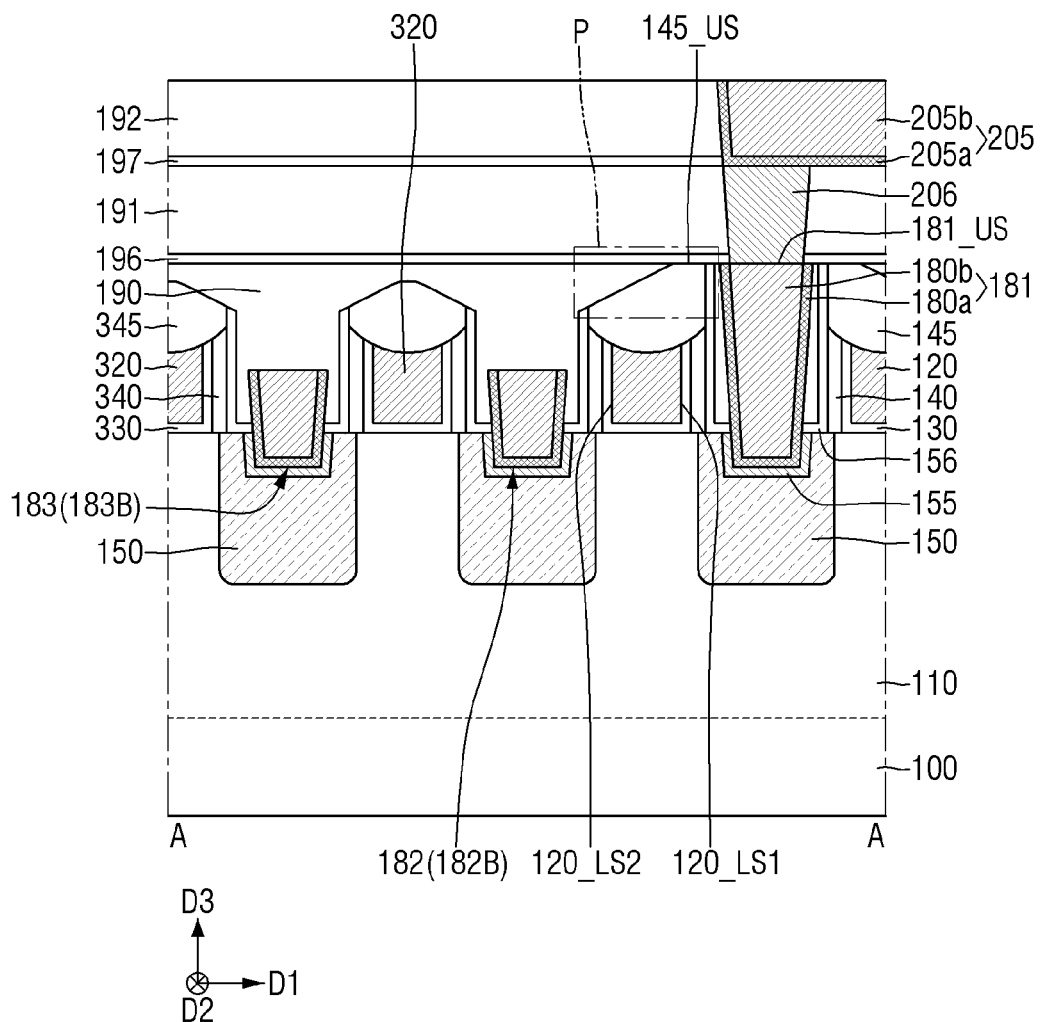
FIGS. 8 and 9 are diagrams for explaining the semiconductor device according to some embodiments.
Figure 9:
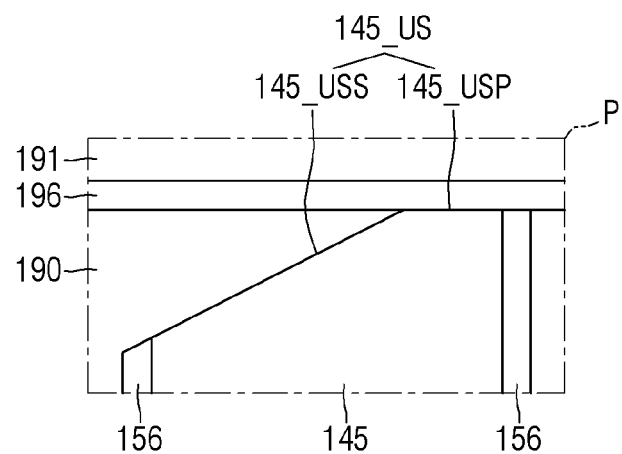
Figure 10:
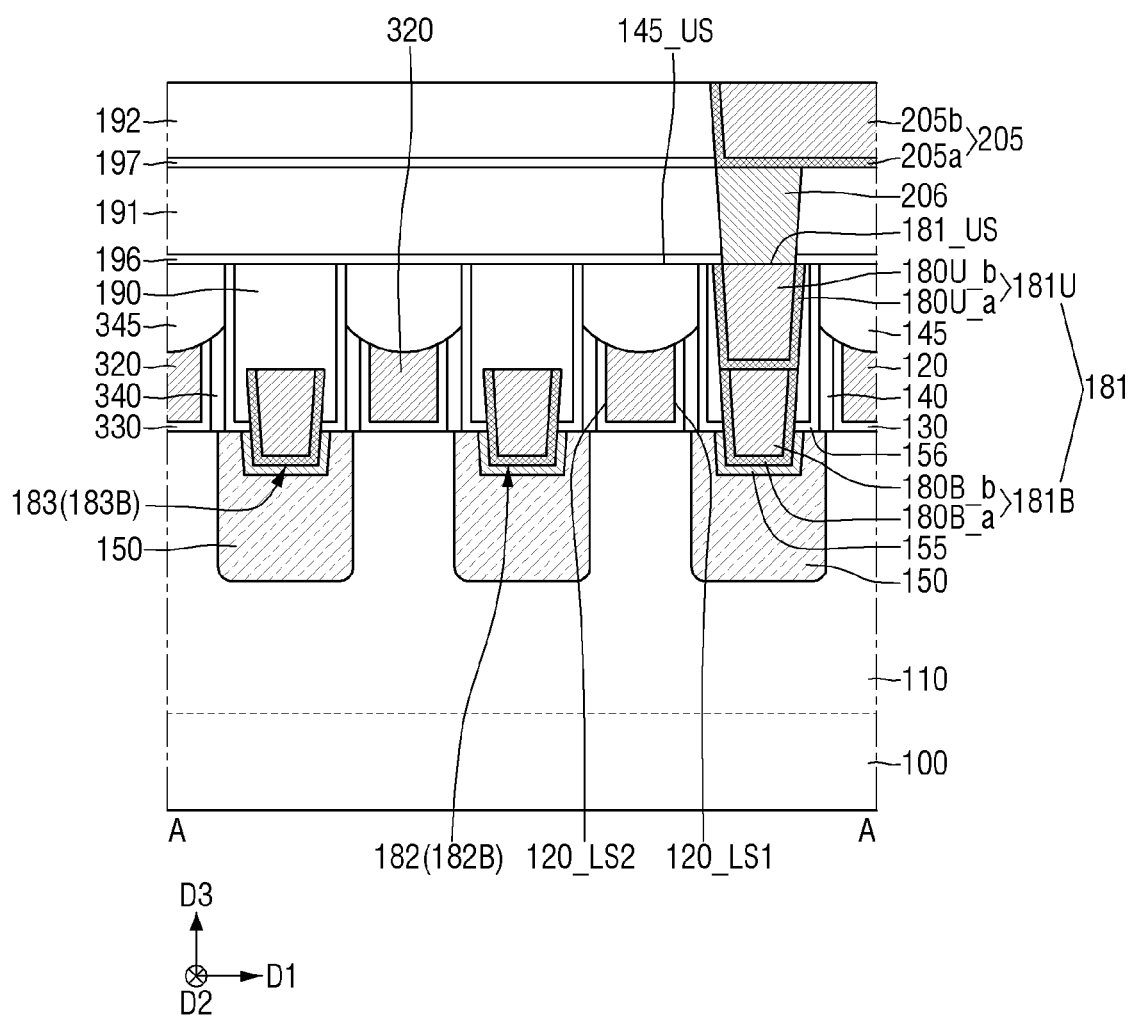
FIGS. 10 and 11 are diagrams for explaining the semiconductor device according to some embodiments.
Figure 11:
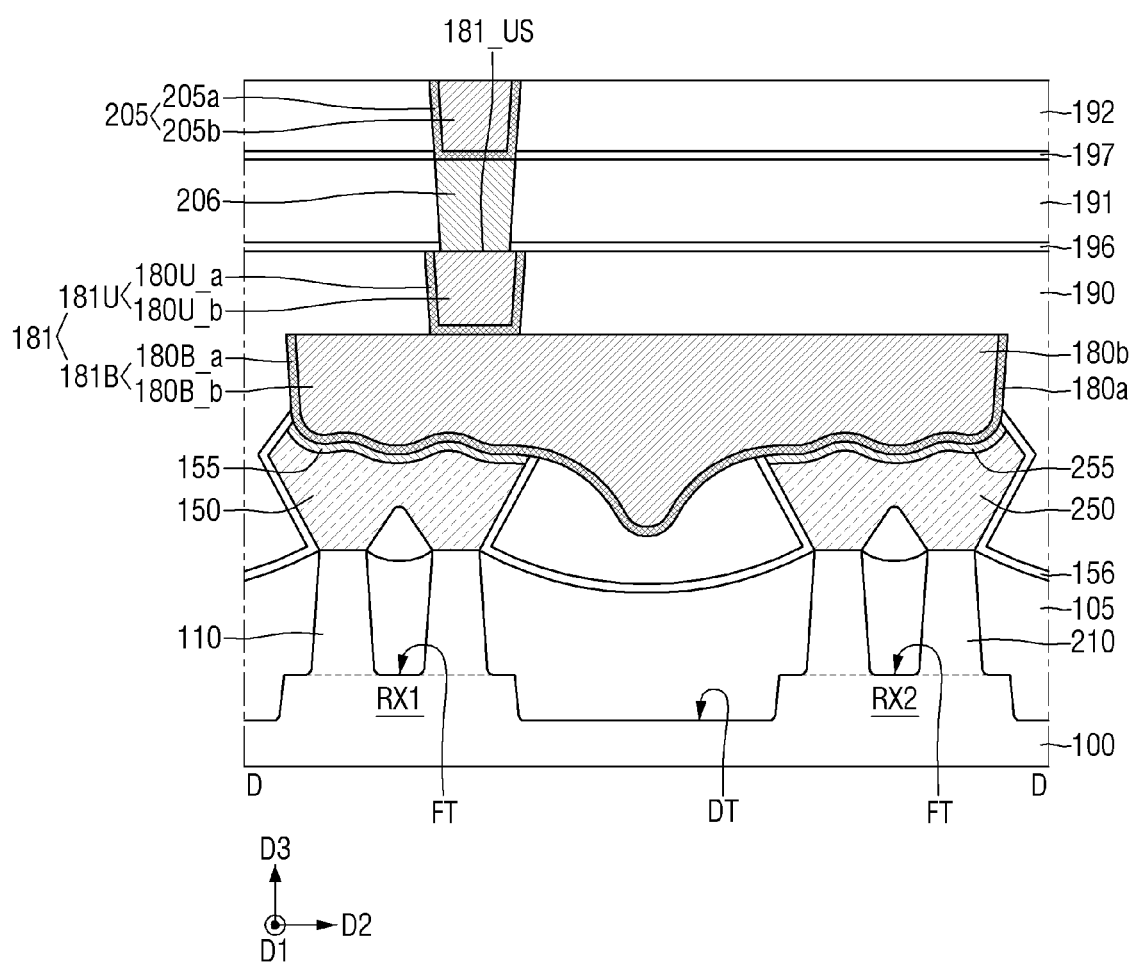
Figure 12:
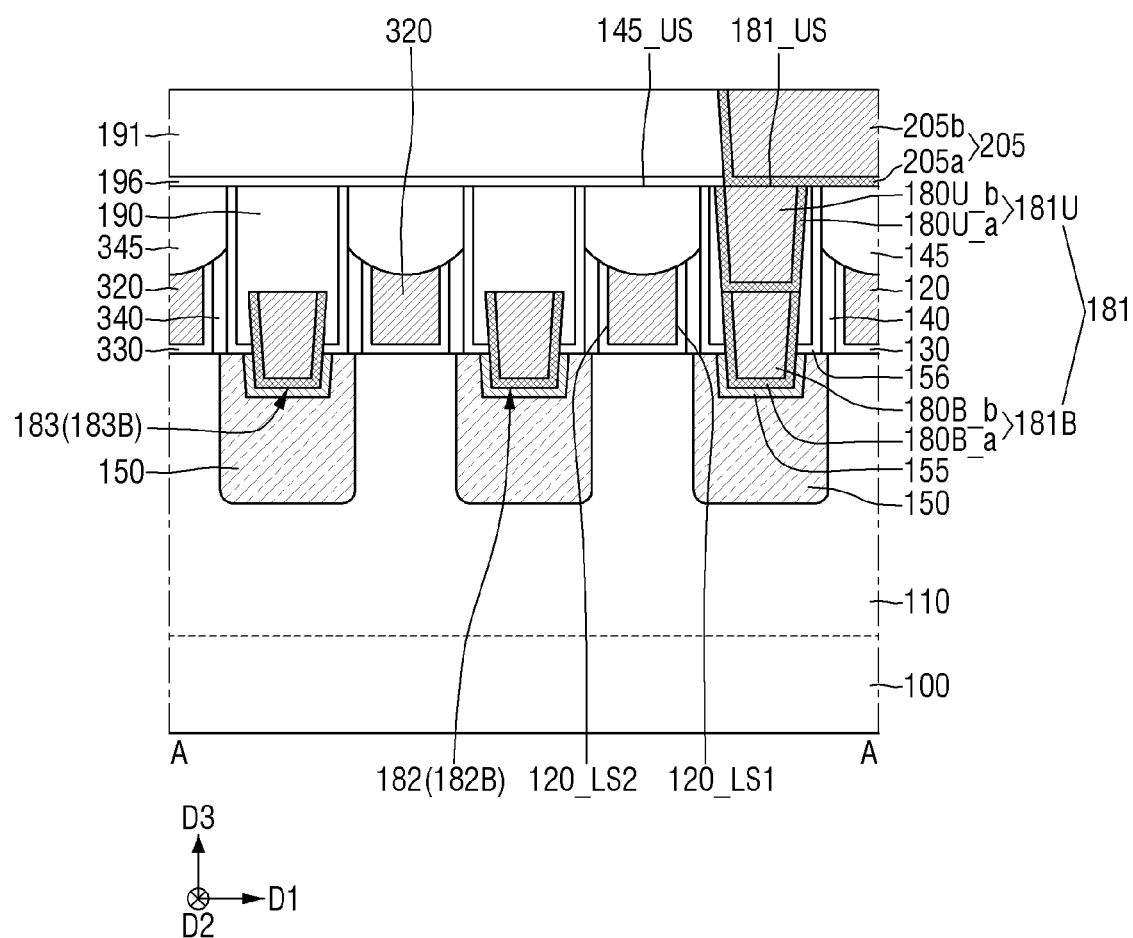
FIG. 12 is a diagram for explaining the semiconductor device according to some embodiments.
Figure 13:
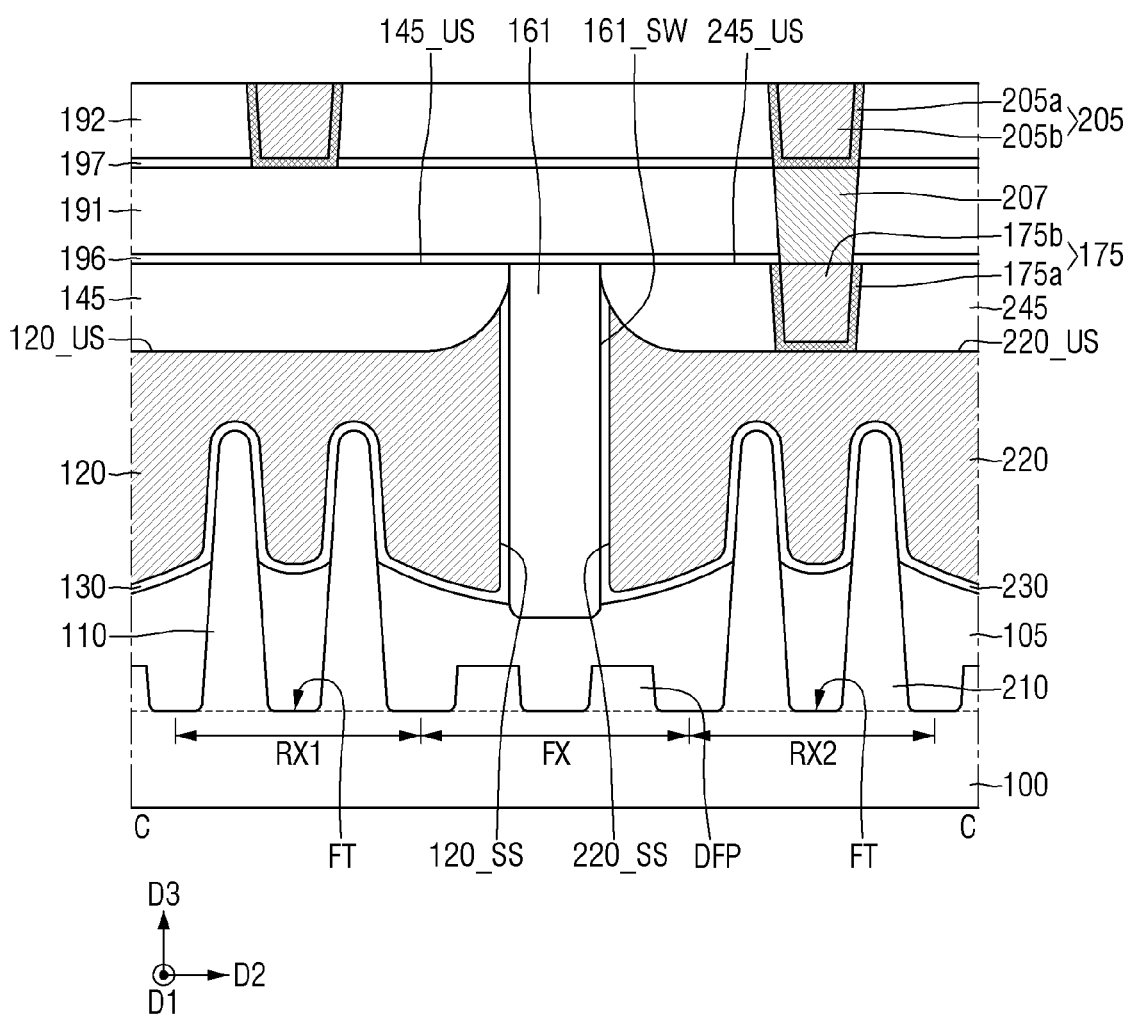
FIG. 13 is a diagram for explaining the semiconductor device according to some embodiments.

FIG. 7 is a diagram for explaining the semiconductor device according to some embodiments. FIGS. 8 and 9 are diagrams for explaining the semiconductor device according to some embodiments. FIGS. 10 and 11 are diagrams for explaining the semiconductor device according to some embodiments. FIG. 12 is a diagram for explaining the semiconductor device according to some embodiments. FIG. 13 is a diagram for explaining the semiconductor device according to some embodiments. For convenience of explanation, differences from those described using FIGS. 1 to 6 will be mainly described. For reference, FIG. 9 is an enlarged view of a portion P of FIG. 8.

Referring to FIG. 7, in the semiconductor device according to some embodiments, a bottom surface of the first lower source/drain contact region 181B may be flat between the first source/drain pattern 150 and the second source/drain pattern 250.

Consequently, the first lower source/drain contact region 181B does not include a downward protruding region (181_DP of FIG. 5).

Referring to FIGS. 8 and 9, in the semiconductor device according to some embodiments, an upper surface 145 US of the first gate capping pattern may include a horizontal planar portion 145_USP and an inclined portion 145_USS.

On the upper surface 145 US of the first gate capping pattern, the horizontal planar portion 145_USP may be located in the peripheral region of the first upper source/drain contact region 181U. The inclined portion 145_USS may be located in the peripheral region of the first lower source/drain contact region 181B.

The inclined portion 145_USS of the upper surface 145 US of the first gate capping pattern may be covered with the lower interlayer insulating film 190. The horizontal planar portion 145_USP of the upper surface 145 US of the first gate capping pattern may be disposed on the same plane as the upper surface 181_US of the first upper source/drain contact region.

The planar portions of the upper surfaces of the first to third gate capping patterns 145, 245 and 345 may be located in the peripheral regions of the first to fourth upper source/drain contact regions 181U, 182U, 183U and 184U. The inclined portions of the upper surfaces of the first to third gate capping patterns 145, 245 and 345 may be located in the peripheral regions of the first to fourth lower source/drain contact regions 181B, 182B, 183B and 184B.

In FIG. 8, when only the lower source/drain contact regions 182B and 183B are located in the peripheral region of the third gate capping pattern 345, the upper surface of the third gate capping pattern 345 may be generally lower than the horizontal planar portion 145_USP of the upper surface 145 US of the first gate capping pattern.

In the etching process for forming the first to fourth upper source/drain contact regions 181U, 182U, 183U and 184U, the first to third gate capping patterns 145, 245 and 345 which are not covered with the mask pattern may be etched. The inclined portions of the upper surfaces of the first to third gate capping patterns 145, 245 and 345 may be formed accordingly.

Referring to FIGS. 10 to 12, in the semiconductor device according to some embodiments, the first connection source/drain contact 181 may include a first lower source/drain contact region 181B and a first upper source/drain contact region 181U which are formed separately from each other.

Because the first lower source/drain contact region 181B and the first upper source/drain contact region 181U are formed through different manufacturing processes from each other, there is a boundary between first lower source/drain contact region 181B and the first upper source/drain contact region 181U.

In view of the manufacturing process, after the first lower source/drain contact region 181B is formed, the first upper source/drain contact region 181U may be formed on the first lower source/drain contact region 181B.

The first lower source/drain contact region 181B may include a lower source/drain barrier film 180B_a and a lower source/drain filling film 180B_b. The first upper source/drain contact region 181U may include an upper source/drain barrier film 180U_a, and an upper source/drain filling film 180U_b. The contents of the materials included in the lower source/drain barrier film 180B_a and the upper source/drain barrier film 180U_a may be the same as the description of the source/drain barrier film (180a of FIG. 2). The description of the lower source/drain filling film 180B_b and the upper source/drain filling film 180U_b may be the same as the description of the source/drain filling film (180b of FIG. 2).

Unlike the shown embodiment, the first upper source/drain contact region 181U may have a single conductive film structure. However, it may still be formed separately from the first lower source/drain contact region 181B, and thus may have a grain boundary at a bottom surface where the bottom surface of the first upper source/drain contact region 181U contacts a top surface of the first lower source/drain contact region 181B.

In FIGS. 10 and 11, the wiring line 205 may be connected to the first upper source/drain contact region 181U through the source/drain via 206.

In FIG. 12, the wiring line 205 may be immediately connected to the first upper source/drain contact region 181U without the source/drain via 206. The wiring line 205 may be disposed inside the first etching stop film 196 and the first upper interlayer insulating film 191.

The description of the second to fourth connection source/drain contacts 182, 183, 184 may be substantially similar to the description of the first connection source/drain contact 181.

Referring to FIG. 13, in the semiconductor device according to some embodiments, the field region FX may be defined by a dummy fin pattern DFP.

The first active region RX1 and the second active region RX2 may be defined by the dummy fin pattern DFP.

The first active region RX1 and the second active region RX2 may be defined between the dummy fin patterns DFP. The upper surface of the dummy fin pattern DFP is entirely covered with the field insulating film 105. The upper surface of the dummy fin pattern DFP is lower than the upper surface of the field insulating film 105. The dummy fin pattern DFP may include, for example, the same material as the first fin-shaped pattern 110 and/or the second fin-shaped pattern 210.

Figure 14:
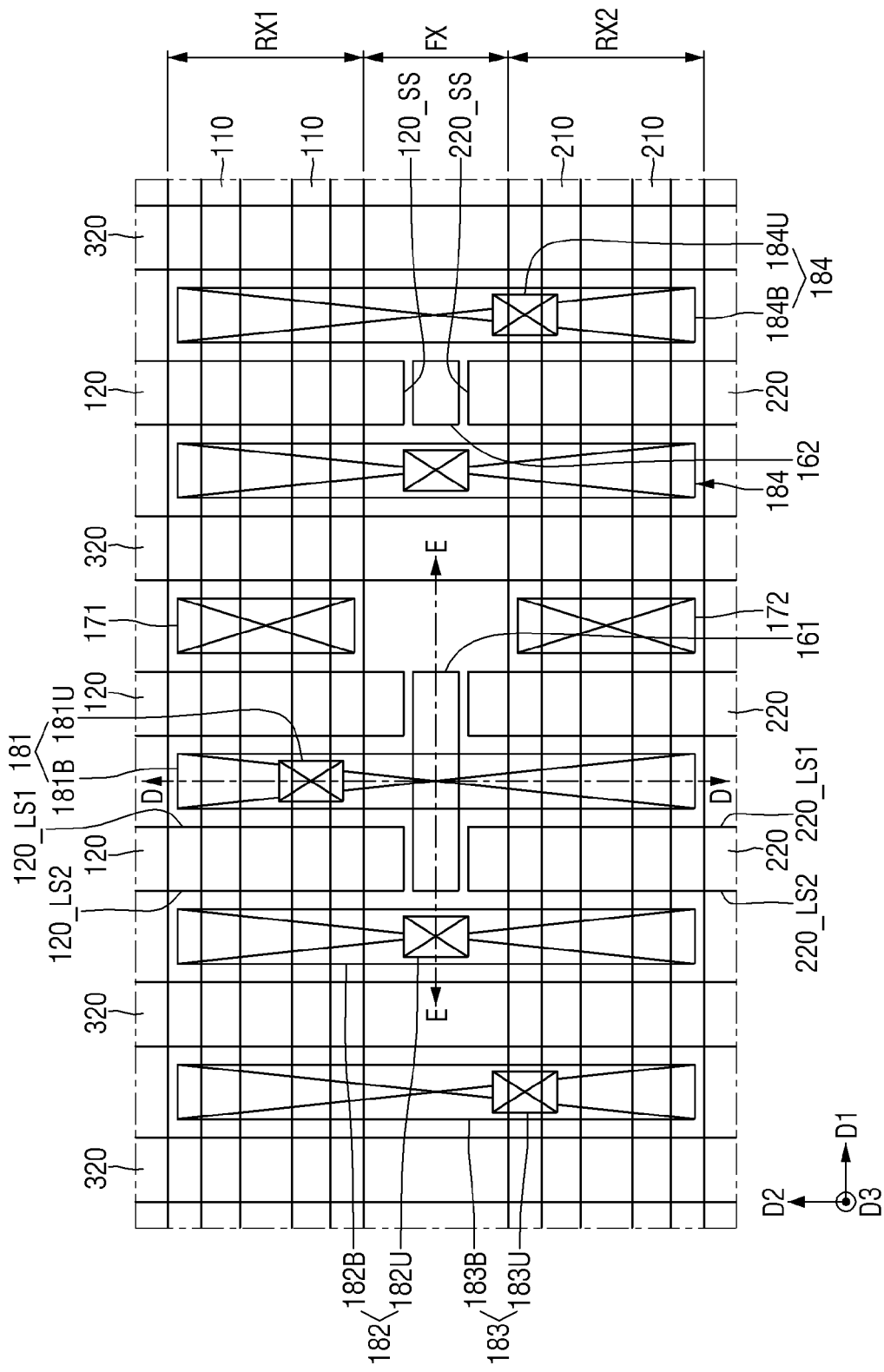
FIGS. 14 to 16 are diagrams for explaining s semiconductor device according to some embodiments.
Figure 15:
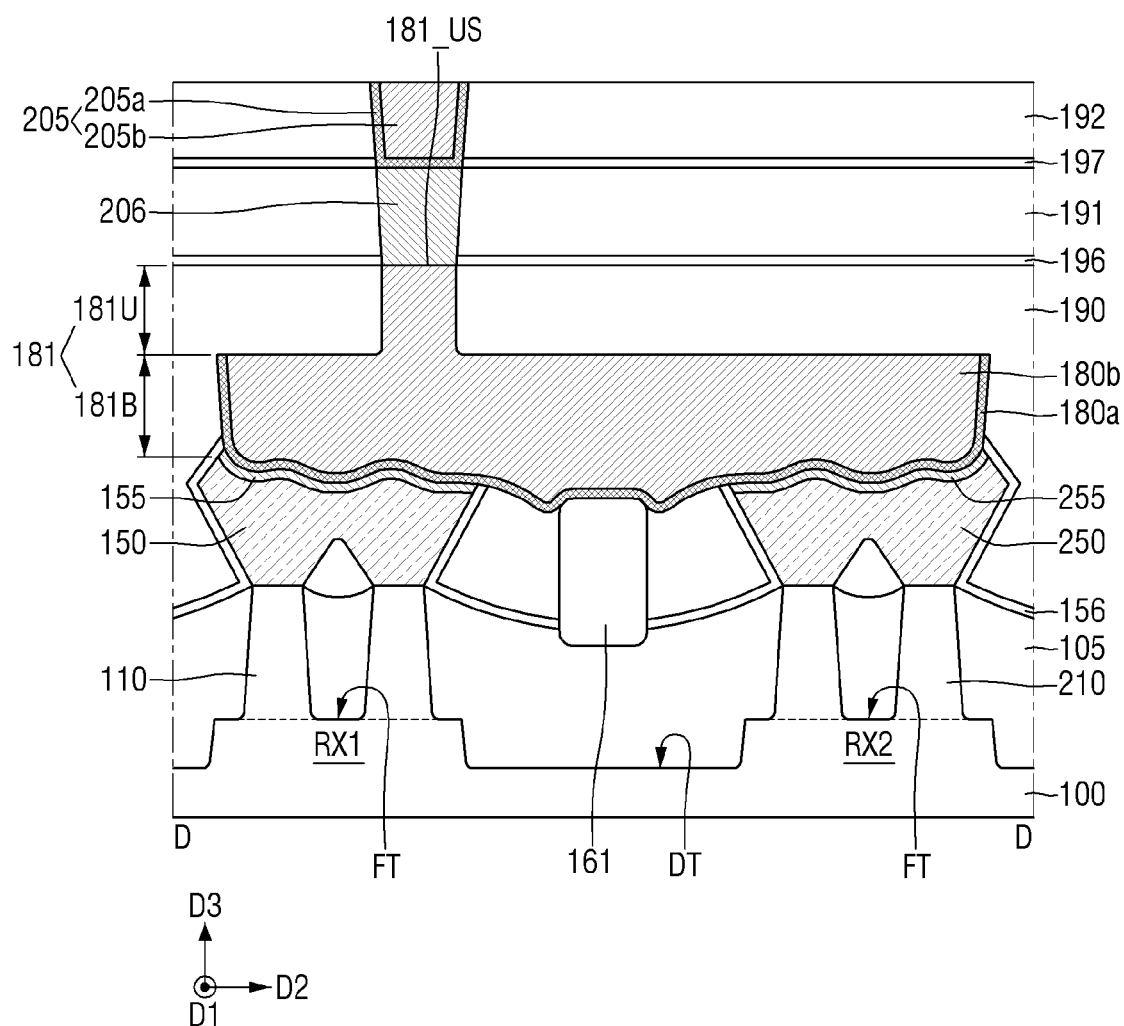
Figure 16:
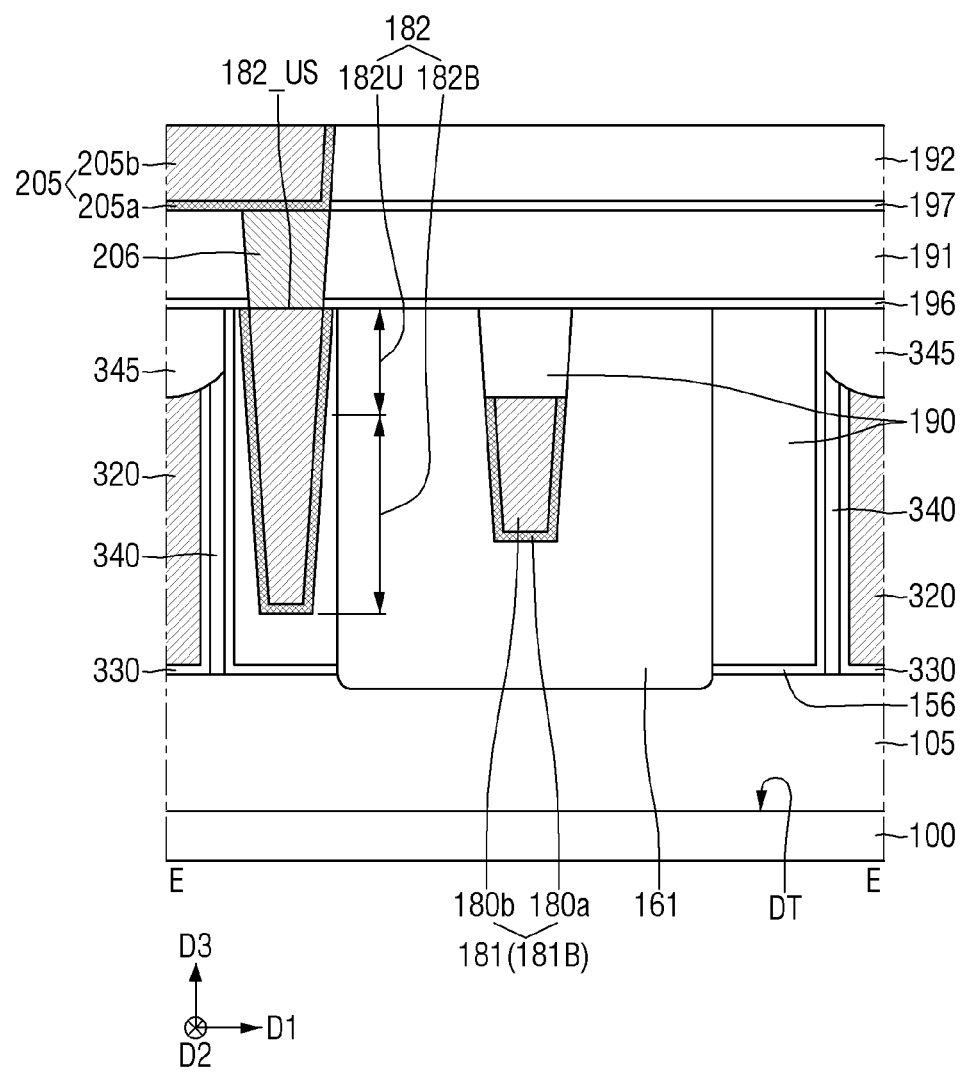

FIGS. 14 to 16 are diagrams for explaining s semiconductor device according to some embodiments. For convenience of explanation, differences from those described using FIGS. 1 to 6 will be mainly described.

Referring to FIGS. 14 to 16, in the semiconductor device according to some embodiments, the single, continuous, first gate separation structure 161 may separate a plurality of first gate electrodes 120 and a plurality of second gate electrodes 220.

For example, the plurality of first gate electrodes 120 may include a first_1 gate electrode and a first_2 gate electrode that are consecutively disposed in the first direction D1. The plurality of second gate electrodes 220 may include a second_1 gate electrode and a second_2 gate electrode that are consecutively disposed in the first direction D1. The first gate separation structure 161 separates not only the first_1 gate electrode and the second_1 gate electrode, but also the first_2 gate electrode and the second_2 gate electrode.

The first connection source/drain contact 181 passes through the first gate separation structure 161. A part of the bottom surface of the first lower source/drain contact region 181B may be in contact with the first gate separation structure 161.

Although FIG. 15 shows that the bottom surface of the first lower source/drain contact region 181B between the first source/drain pattern 150 and the second source/drain pattern 250 has a shape similar to "W", the present invention is not limited thereto.

Figure 17:
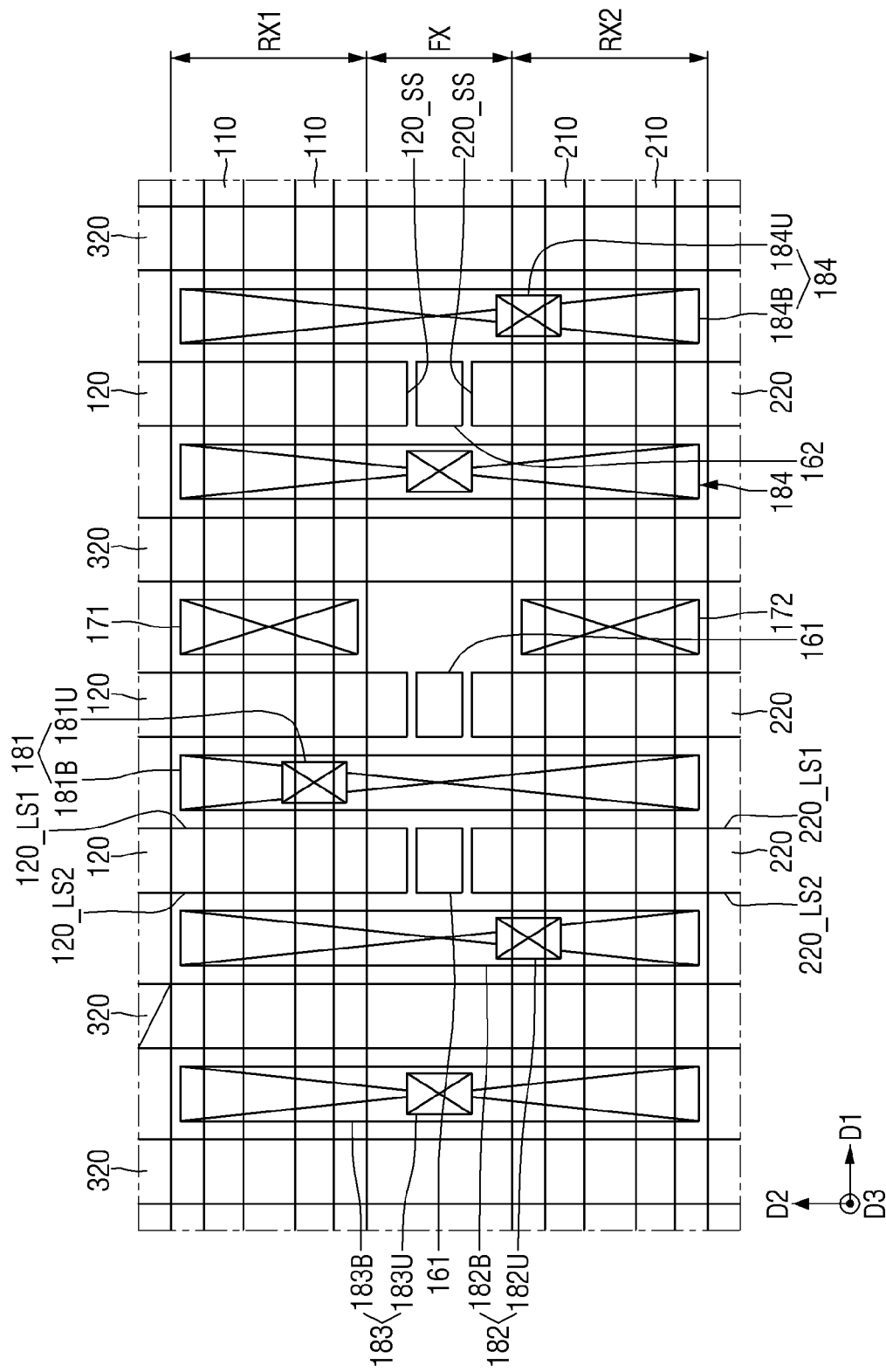
FIGS. 17 to 19 are layout diagrams for explaining a semiconductor device according to some embodiments.
Figure 18:
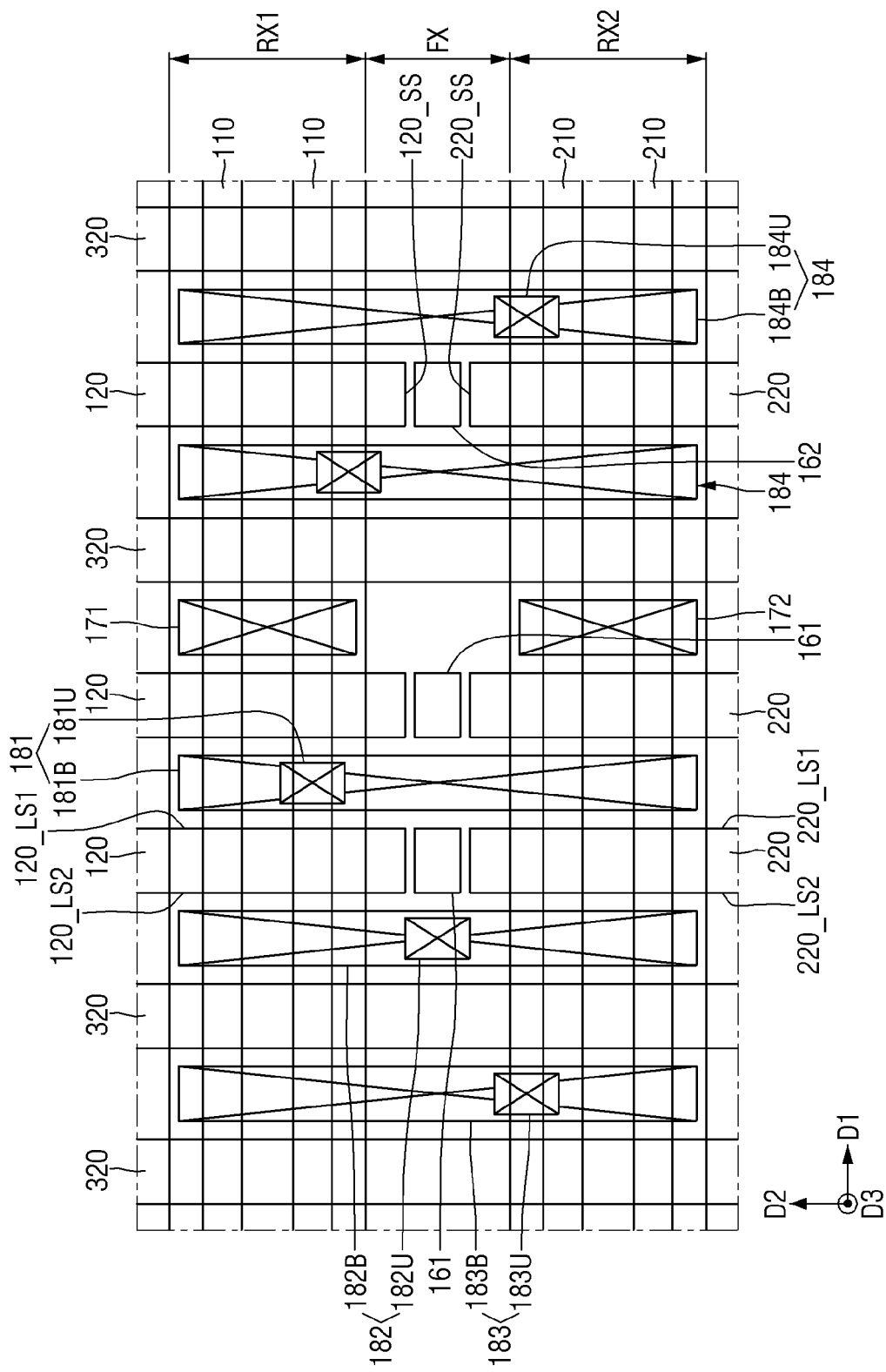
Figure 19:
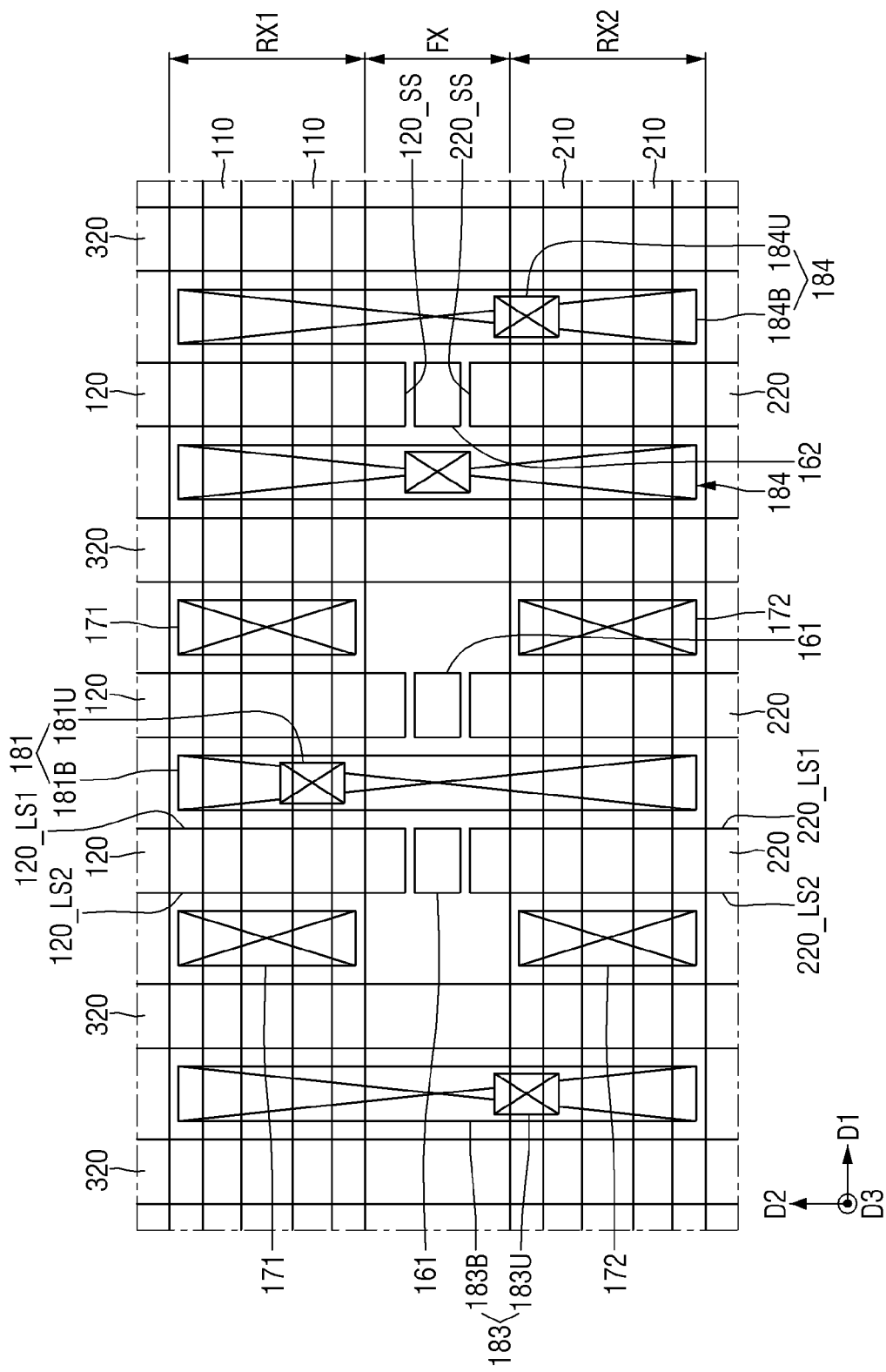

FIGS. 17 to 19 are layout diagrams for explaining a semiconductor device according to some embodiments. For convenience of explanation, differences from those described using FIGS. 1 to 6 will be mainly described.

Referring to FIG. 17, in the semiconductor device according to some embodiments, the second upper source/drain contact region 182U does not overlap the first gate separation structure 161 in the first direction D1.

In the first connection source/drain contact 181 and the second connection source/drain contact 182 disposed with the first gate separation structure 161 interposed therebetween, the first upper source/drain contact region 181U and the second upper source/drain contact region 182U may each be disposed at positions where they do not overlap the first gate separation structure 161 in the first direction D1.

Referring to FIG. 18, in the semiconductor device according to some embodiments, when the fourth connection source/drain contacts 184 are disposed on both sides of the second gate separation structure 162, the fourth upper source/drain contact regions 184U of each fourth connection source/drain contact 184 may not overlap the second gate separation structure 162 in the first direction D1.

Referring to FIG. 19, in the semiconductor device according to some embodiments, the second connection source/drain contact (182 of FIG. 1) may not be disposed on one side of the first connection source/drain contact 181.

A first source/drain contact 171 and a second source/drain contact 172 may be disposed on both sides of the first connection source/drain contact 181.

FIGS. 20 to 25 are diagrams for explaining the semiconductor device according to some embodiments. For convenience of explanation, differences from those described using FIGS. 1 to 6 will be mainly described.

Figure 20:
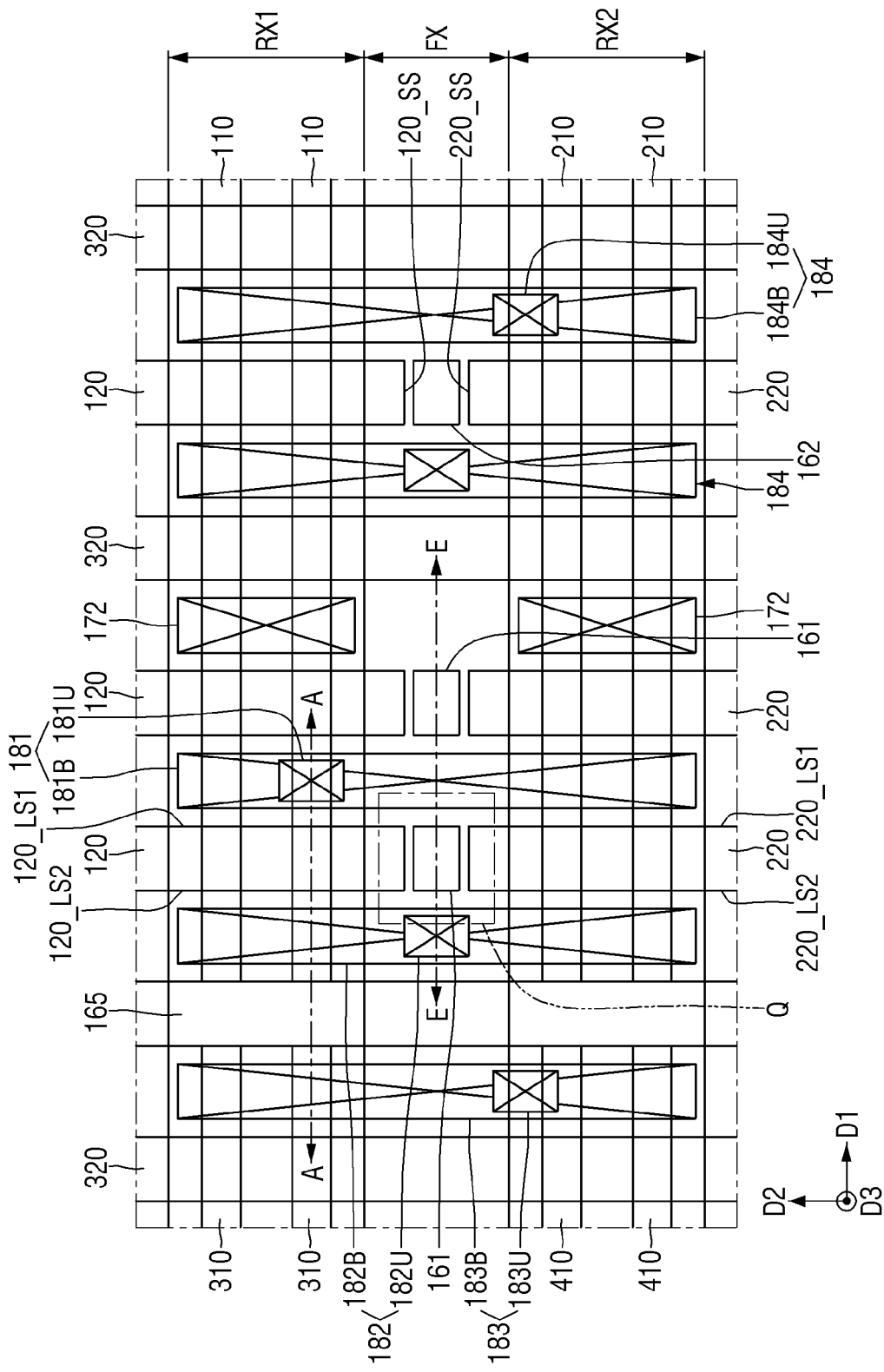
FIGS. 20 to 25 are diagrams for explaining the semiconductor device according to some embodiments.
Figure 21:
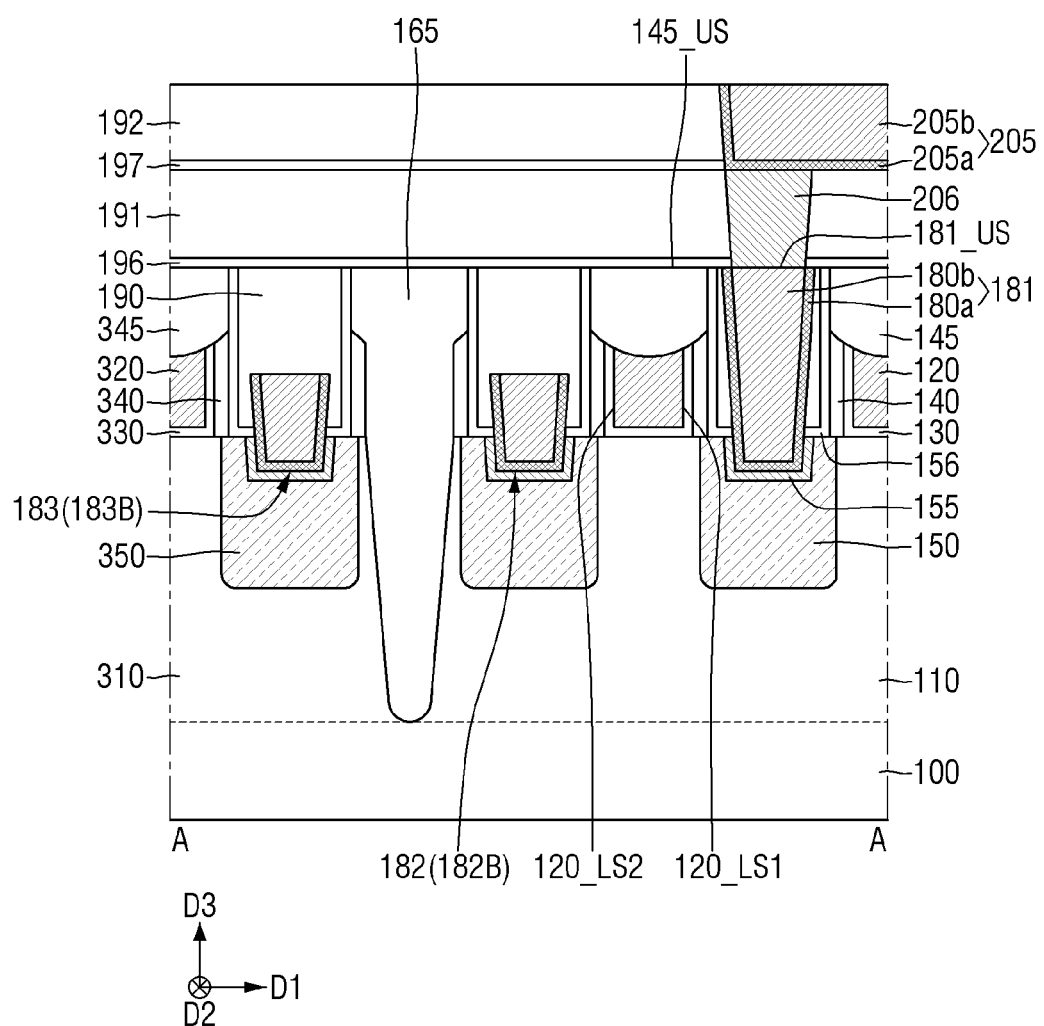
Figure 22:
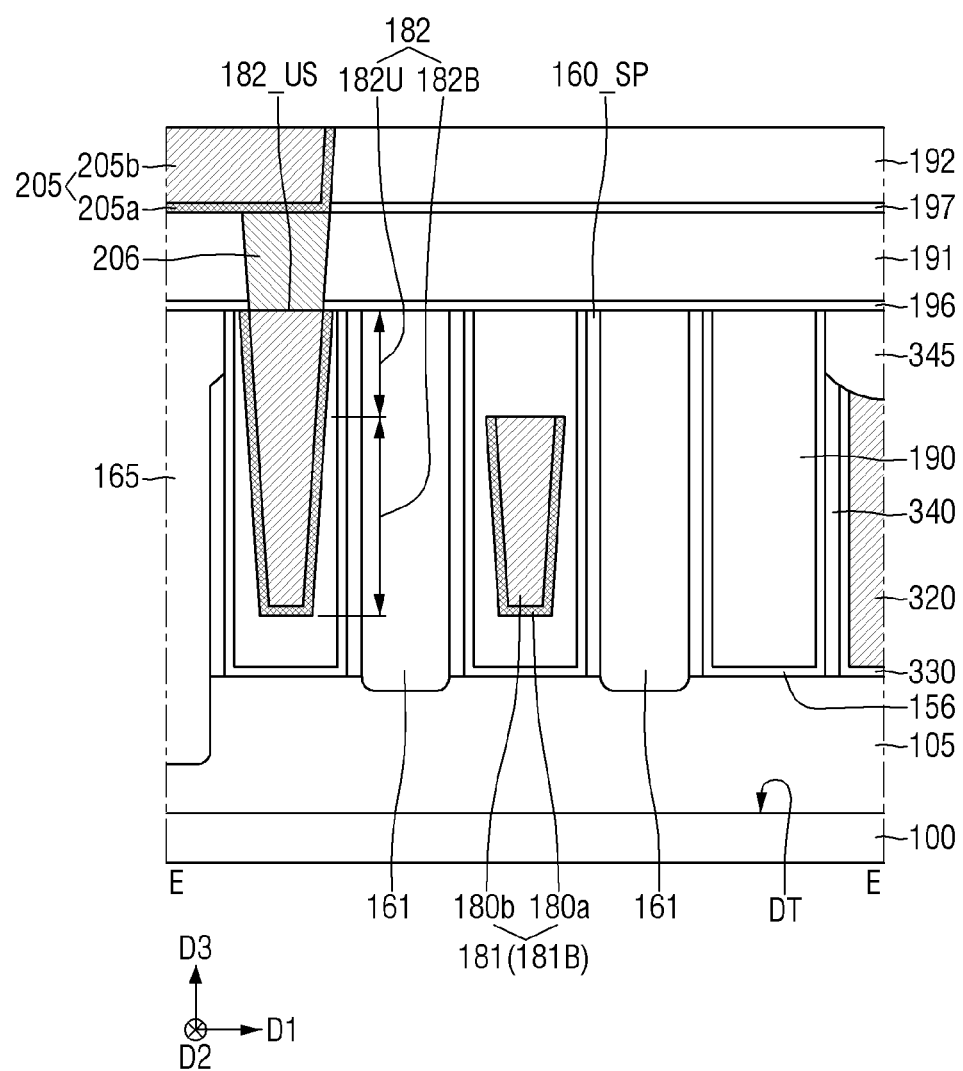
Figure 23:
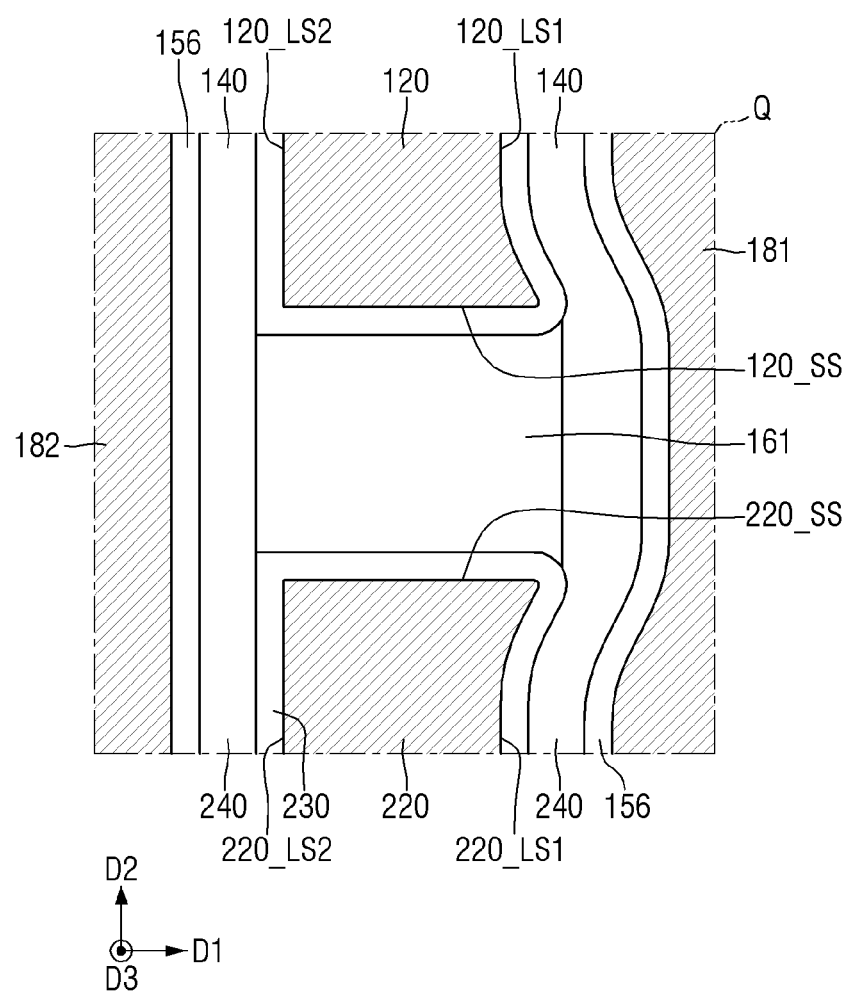
Figure 24:
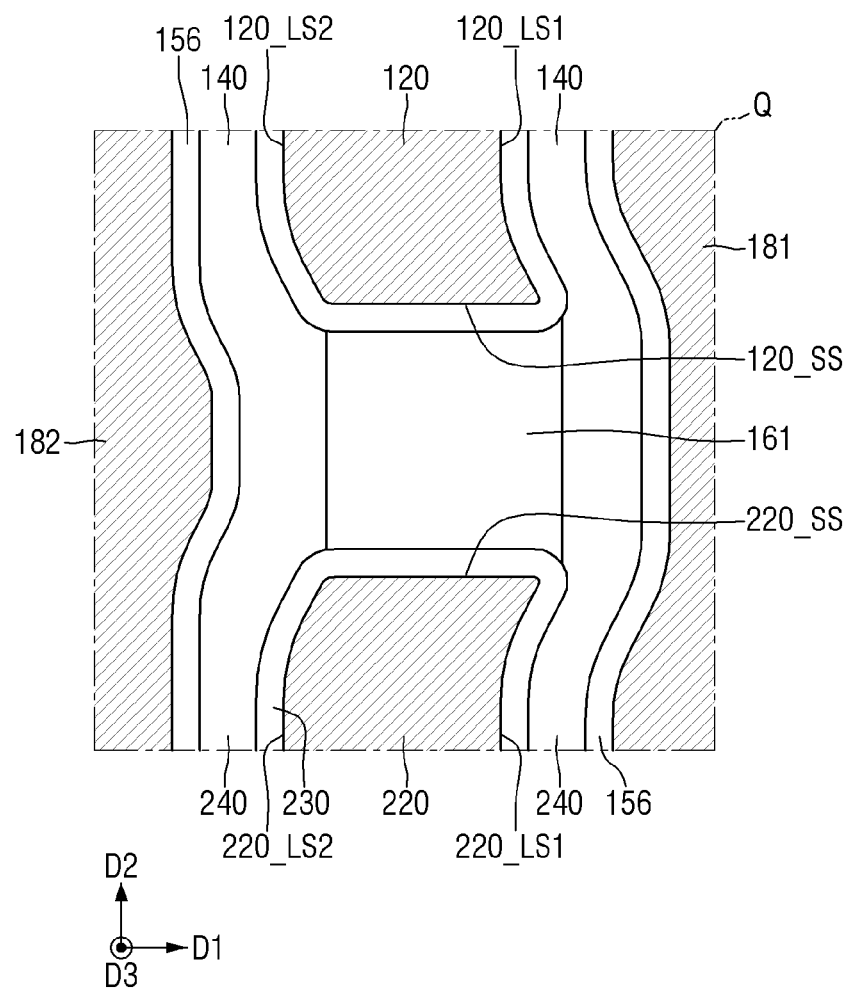
Figure 25:
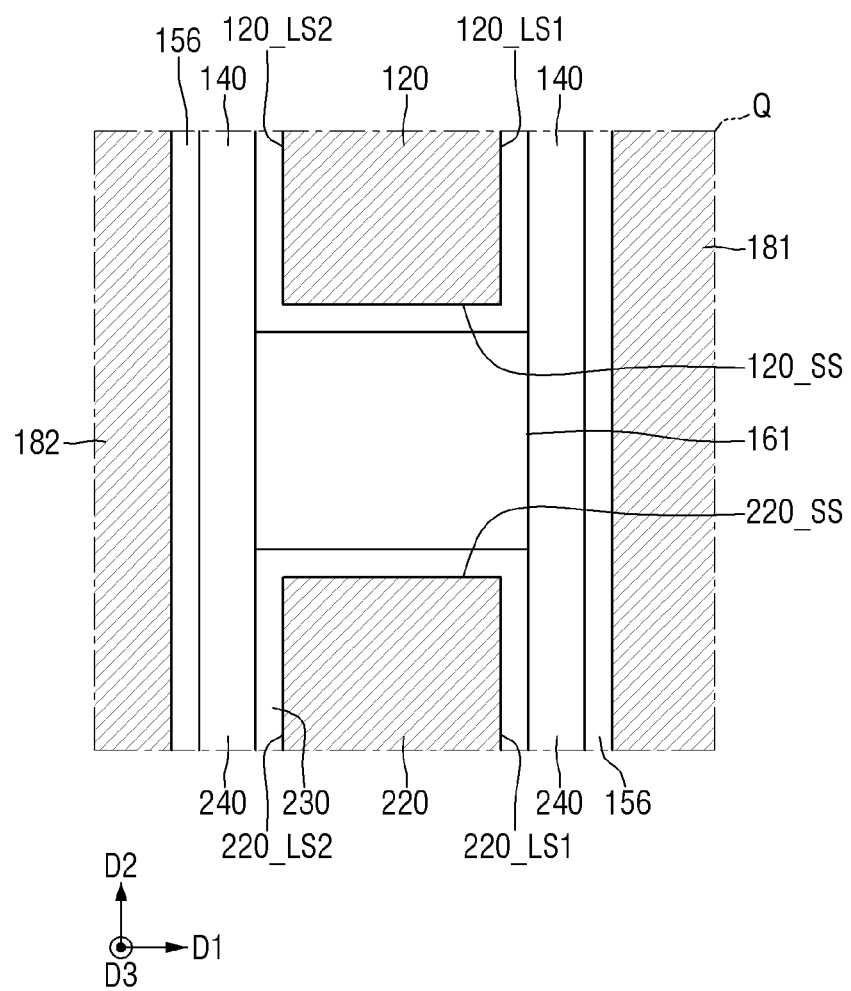

For reference, FIG. 20 is a layout diagram for explaining a semiconductor device according to some embodiments. FIGS. 21 and 22 are cross-sectional views taken along A-A and E-E of FIG. 20. FIGS. 23 to 25 are diagrams showing a schematic plan view of a portion Q of FIG. 20.

Referring to FIGS. 20 to 25, the semiconductor device according to some embodiments may further include an element separation structure 165.

The element separation structure 165 may be disposed over the first active region RX1 and the second active region RX2. The element separation structure 165 may extend lengthwise in the second direction D2.

The element separation structure 165 may separate the first fin-shaped pattern 110 and the third fin-shaped pattern 310 that are adjacent to each other in the first direction D1. The element separation structure 165 may separate the second fin-shaped pattern 210 and the fourth fin-shaped pattern 410 that are adjacent to each other in the first direction D1.

The third fin-shaped pattern 310 and the fourth fin-shaped pattern 410 may each extend lengthwise in the first direction D1. The third fin-shaped pattern 310 may be formed inside the first active region RX1. The fourth fin-shaped pattern 410 may be formed inside the second active region RX2. The third fin-shaped pattern 310 includes the same material as the first fin-shaped pattern 110. The fourth fin-shaped pattern 410 includes the same material as the second fin-shaped pattern 210.

The upper surface of the element separation structure 165 may be disposed at the same plane as the upper surface 145 US of the first gate capping pattern. A part of the element separation structure 165 may penetrate into the field insulating film 105.

The element separation structure 165 may include or be formed of, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the element separation structure 165 is shown as a single film, the embodiment is not limited thereto.

A part of the third gate electrode 320 is disposed on the third fin-shaped pattern 310 and the fourth fin-shaped pattern 410, and may intersect the third fin-shaped pattern 310 and the fourth fin-shaped pattern 410.

The second long side wall 120_LS2 of the first gate electrode and the second long side wall 220_LS2 of the second gate electrode may face the element separation structure 165.

A third source/drain pattern 350 may be disposed on the third fin-shaped pattern 310. The third source/drain pattern 350 may be disposed on at least one side of the third gate electrode 320. The third source/drain pattern 350 may be connected to the third fin-shaped pattern 310. The third source/drain pattern 350 may be disposed in the first active region RX1.

The second connection source/drain contact 182 may be disposed between the element separation structure 165 and the first gate electrode 120, and between the element separation structure 165 and the second gate electrode 220. The element separation structure 165 may extend in the second direction D2 along the second connection source/drain contact 182. The upper source/drain contact region of the second connection source/drain contact 182 may overlap the gate separation region 161, as shown in FIGS. 20 and 22, or in some embodiments, it may not overlap the gate separation region 161, such as shown, for example, in FIG. 17.

The third connection source/drain contact 183 may be disposed between the third gate electrode 320 and the element separation structure 165, or between the third gate electrodes 320.

In FIGS. 23 and 24, the first long side wall 120_LS1 of the first gate electrode and the first long side wall 220_LS1 of the second gate electrode may each include a bending, or curved, portion. The bending portions of the first long side wall 120_LS1 of the first gate electrode and the first long side wall 220_LS1 of the second gate electrode may be adjacent to the first gate separation structure 161.

The first long side wall 120_LS1 of the first gate electrode and the first long side wall 220_LS1 of the second gate electrode may each be bent toward the first connection source/drain contact 181, as they approach the first gate separation structure 161.

By replacing the third gate electrode 320 with the element separation structure 165, the insulating material included in the element separation structure 165 may apply a stress to the first gate electrode 120 and the second gate electrode 220. As a result, in the portion in which the first gate electrode 120 and the second gate electrode 220 are separated, the first long side wall 120_LS1 of the first gate electrode and the first long side wall 220_LS1 of the second gate electrode may be bent.

In FIG. 23, each of the second long side wall 120_LS2 of the first gate electrode and the first long side wall 220_LS2 of the second gate electrode is not bent toward the first connection source/drain contact 181, as they approach the first gate separation structure 161.

In FIG. 24, the second long side wall 120_LS2 of the first gate electrode and the first long side wall 220_LS2 of the second gate electrode may each be bent toward the first connection source/drain contact 181, as they approach the first gate separation structure 161.

In FIG. 25, at a boundary portion with the first gate separation structure 161, the first long side wall 120_LS1 of the first gate electrode and the first long side wall 220_LS1 of the second gate electrode may not be bent toward the first connection source/drain contact 181, respectively. At the boundary portion with the first gate separation structure 161, the second long side wall 120_LS2 of the first gate electrode and the first long side wall 220_LS2 of the second gate electrode are not bent toward the first connection source/drain contact 181, respectively.

Figure 26:
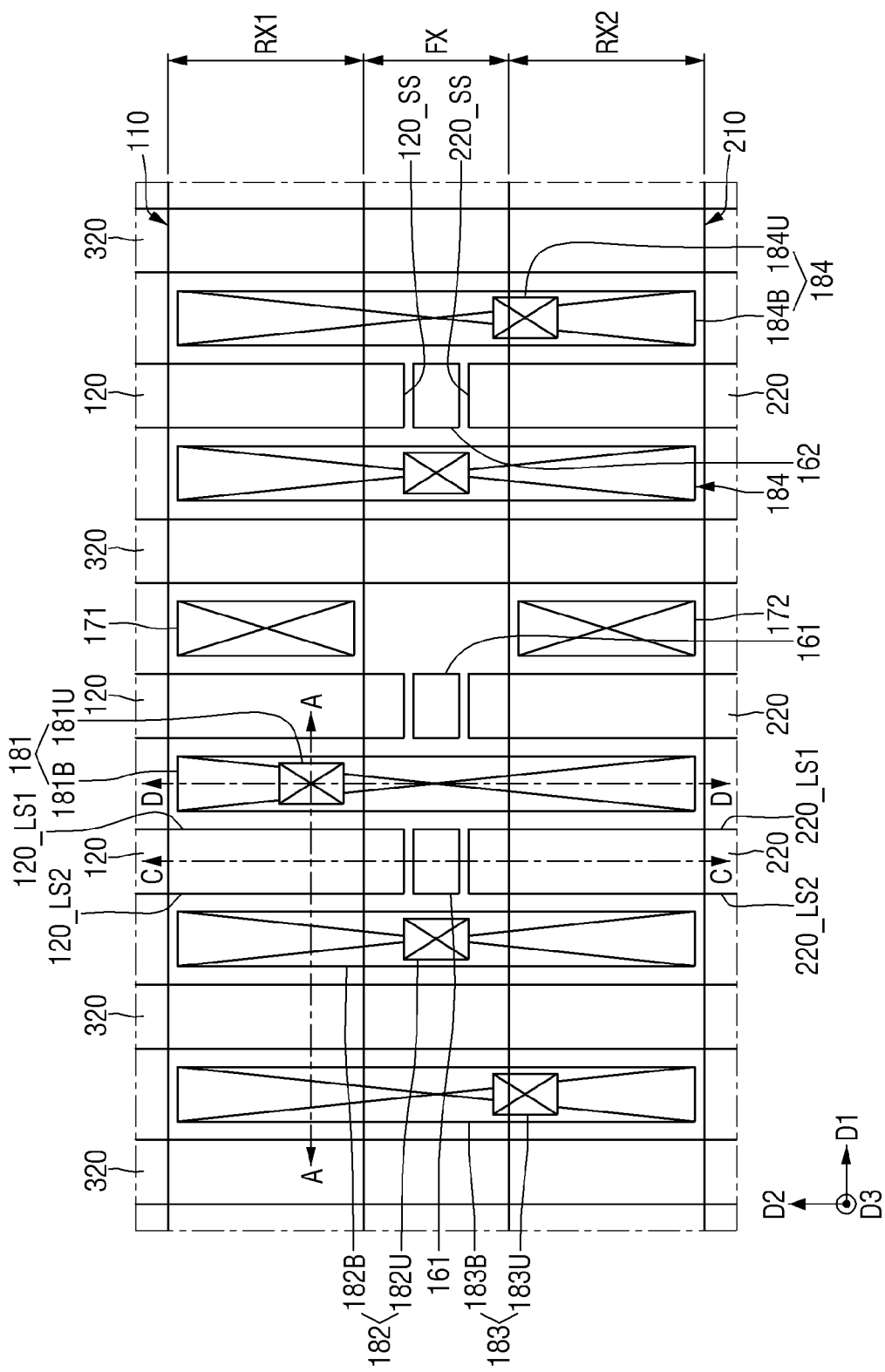
FIGS. 26, 27A, 27B, 28, and 29 are diagrams for explaining a semiconductor device according to some embodiments.
Figure 27A:
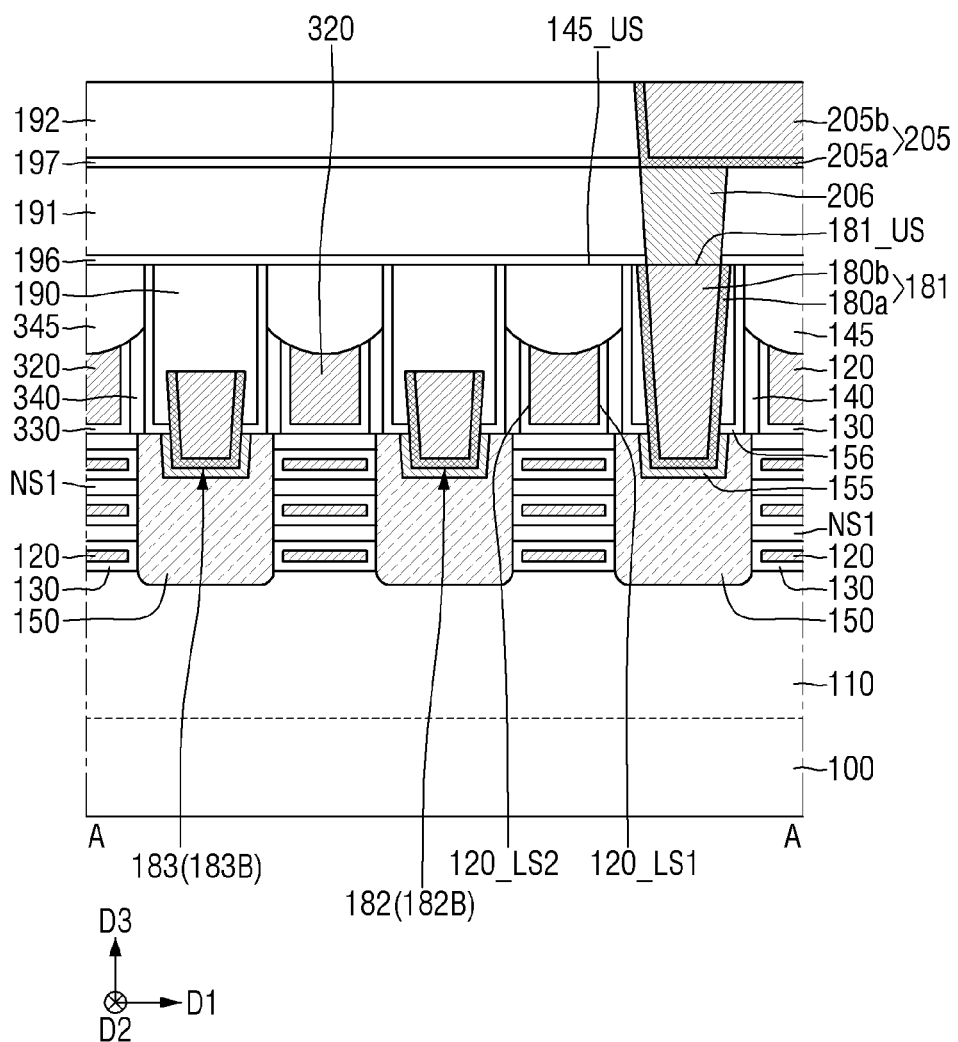
Figure 27B:
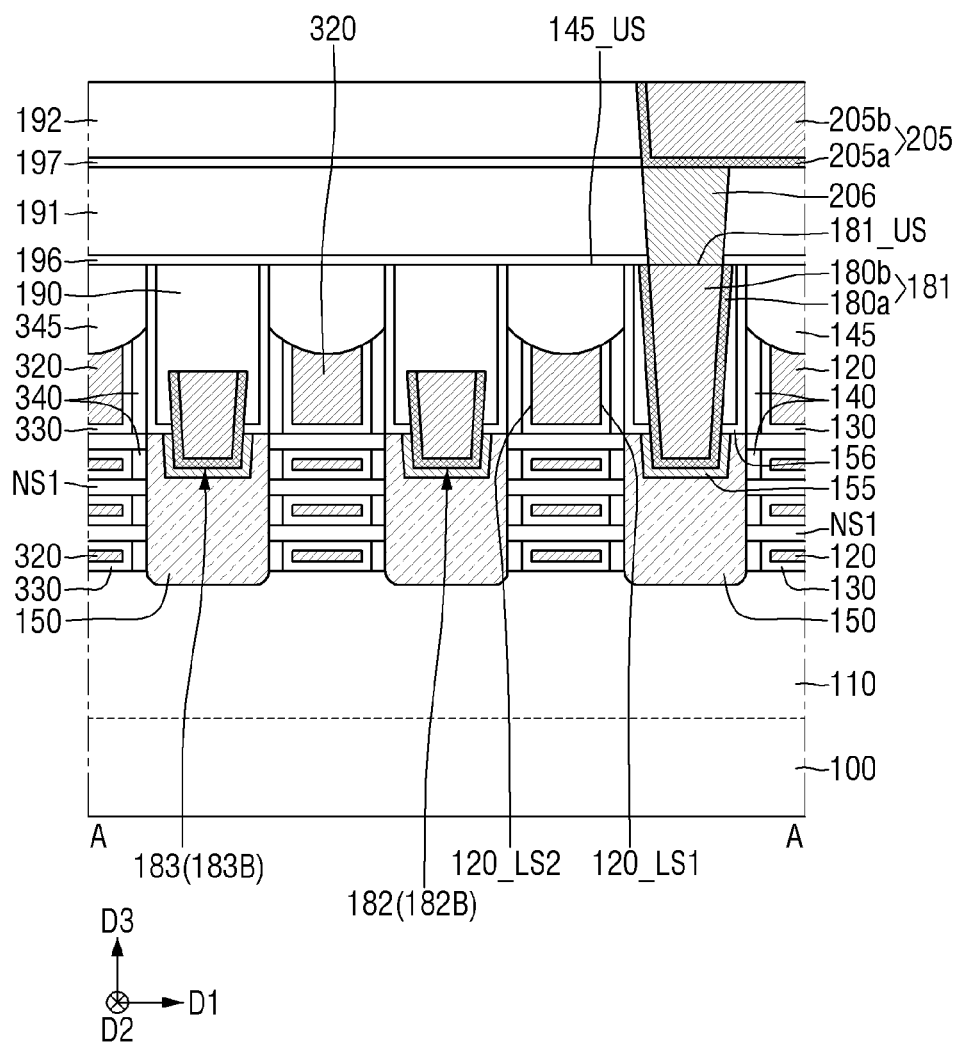
Figure 28:
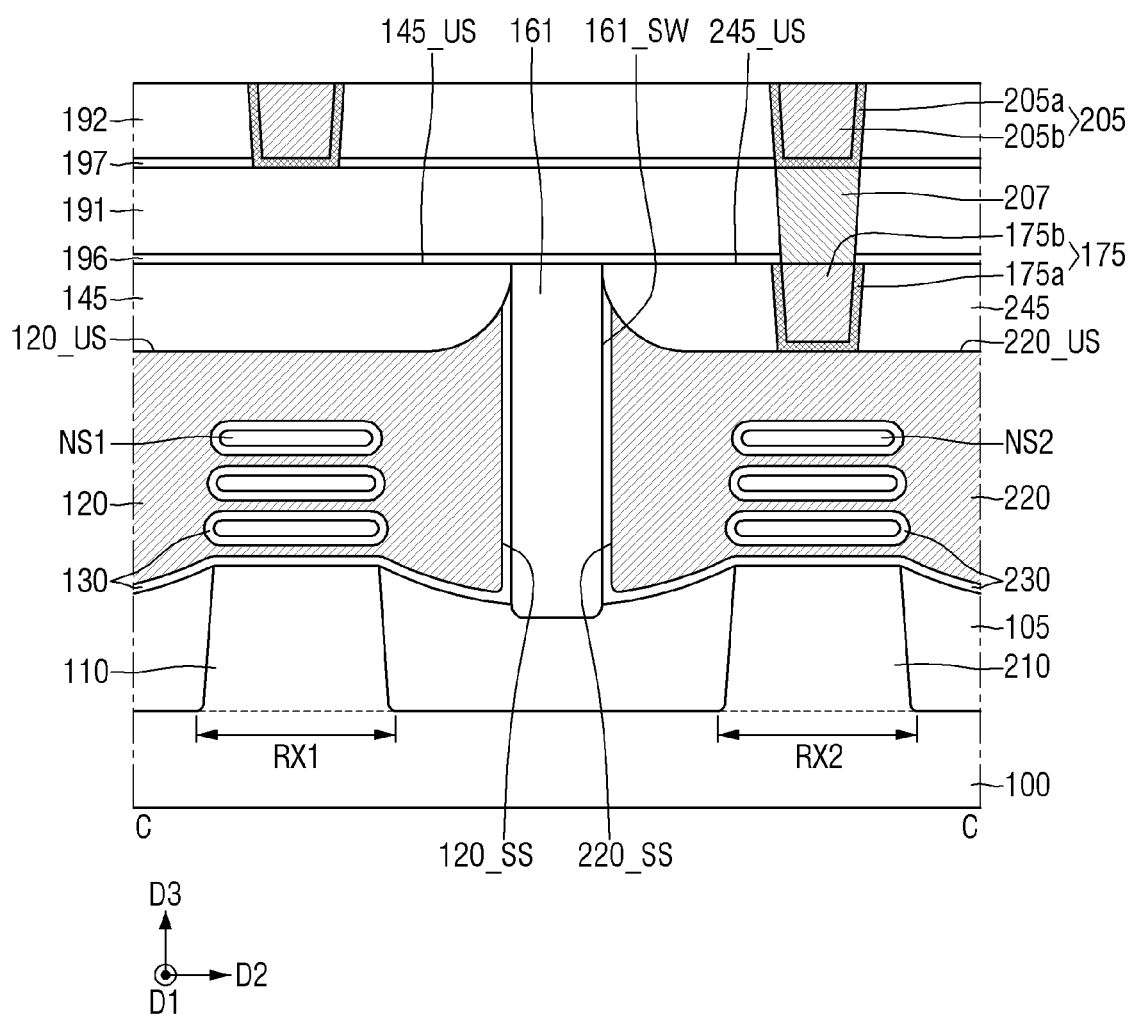
Figure 29:
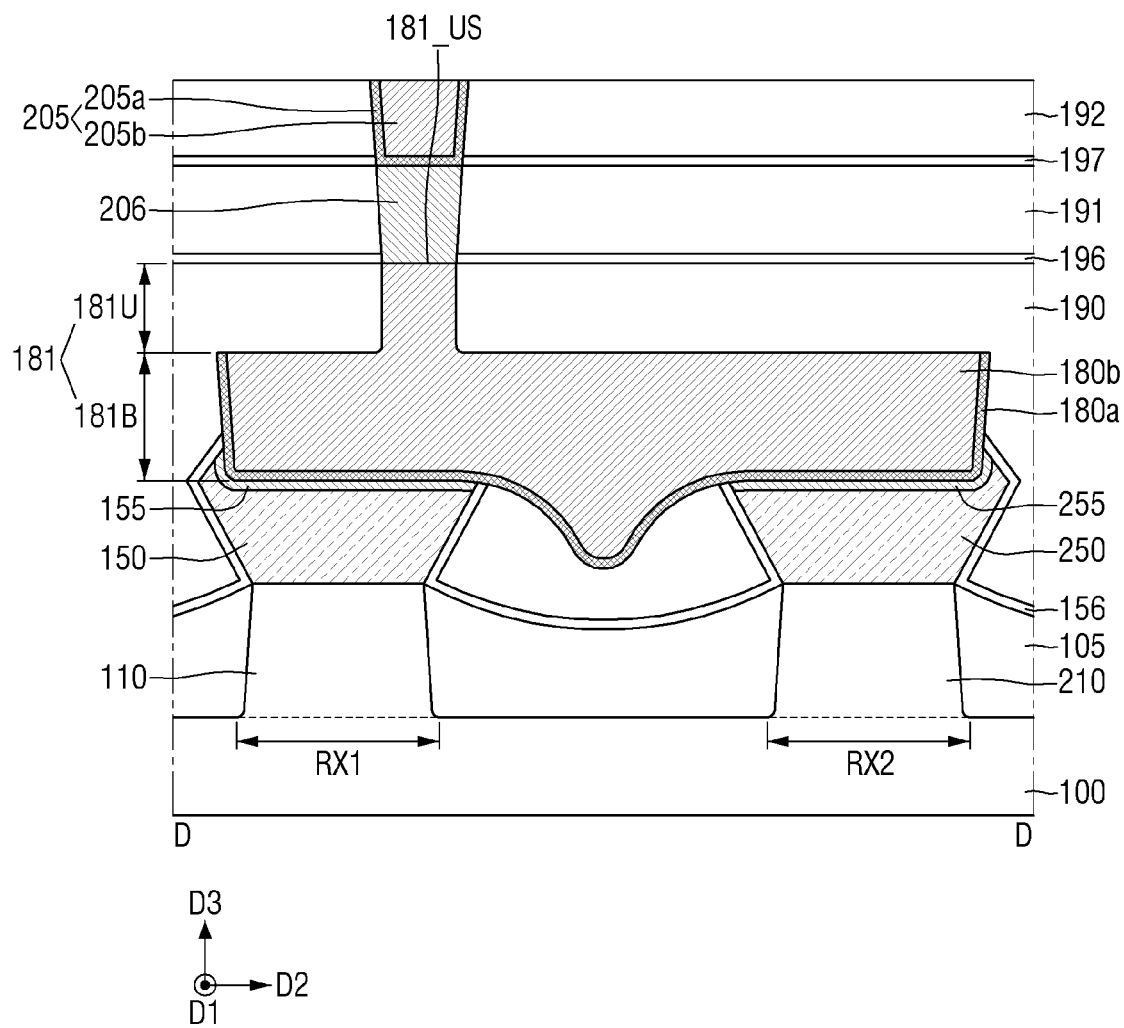

FIGS. 26 to 29 are diagrams for explaining a semiconductor device according to some embodiments. FIG. 26 is an exemplary layout diagram for explaining the semiconductor device according to some embodiments. FIGS. 27a and 27b are cross-sectional views taken along A-A of FIG. 26. FIG. 28 is a cross-sectional view taken along C-C of FIG. 26. FIG. 29 is a cross-sectional view taken along D-D of FIG. 26. For convenience of explanation, differences from those described using FIGS. 1 to 6 will be mainly described.

Referring to FIGS. 26 to 29, the semiconductor device according to some embodiments may further include a first sheet pattern NS1 spaced apart from the first fin-shaped pattern 110 in the third direction D3, and a second sheet pattern NS2 spaced apart from the second fin-shaped pattern 210 in the third direction D3.

The first active region RX1 and the second active region RX2 may be divided by the first fin-shaped pattern 110 and the second fin-shaped pattern 210.

The first sheet pattern NS1 may be disposed on the first fin-shaped pattern 110 to be spaced apart from the first fin-shaped pattern 110. The first sheet pattern NS1 may include a plurality of sheet patterns. The second sheet pattern NS2 may be disposed on the second fin-shaped pattern 210 to be spaced apart from the second fin-shaped pattern 210. The second sheet pattern NS2 may include a plurality of sheet patterns.

Although the number of each of the first sheet patterns NS1 and the second sheet patterns NS2 is shown as three, this is only for convenience of explanation, and the number thereof is not limited thereto.

The first gate insulating film 130 may extend along the upper surface of the first fin-shaped pattern 110 and the upper surface of the field insulating film 105. The first gate insulating film 130 may wrap around the first sheet pattern NS1. The second gate insulating film 230 may extend along the upper surface of the second fin-shaped pattern 210 and the upper surface of the field insulating film 105. The second gate insulating film 230 may wrap around the second sheet pattern NS2.

The first gate electrode 120 is disposed on the first fin-shaped pattern 110. The first gate electrode 120 intersects the first fin-shaped pattern 110. The first gate electrode 120 may surround the first sheet pattern NS1. The first gate electrode 120 may be disposed between the first fin-shaped pattern 110 and the first sheet pattern NS1, and between the adjacent first sheet patterns NS1.

The second gate electrode 220 is disposed on the second fin-shaped pattern 210. The second gate electrode 220 intersects the second fin-shaped pattern 210. The second gate electrode 220 may surround the second sheet pattern NS2. The second gate electrode 220 may be disposed between the second fin-shaped pattern 210 and the second sheet pattern NS2, and between the adjacent second sheet patterns NS2.

In FIG. 27a, the first gate spacer 140 is not disposed between the first fin-shaped pattern 110 and the first sheet pattern NS1, and between the adjacent first sheet patterns NS1. Further, the third gate spacer 340 is not disposed between the first fin-shaped pattern 110 and the first sheet pattern NS1, and between the adjacent first sheet patterns NS1.

In FIG. 27b, the first gate spacer 140 and the third gate spacer 340 may each be disposed between the first fin-shaped pattern 110 and the first sheet pattern NS1, and between the adjacent first sheet patterns NS1.

The cross-sectional view taken along the second fin-shaped pattern 210 may be similar to either FIG. 27a or FIG. 27b.

The first source/drain pattern 150 may be connected to the adjacent first sheet pattern NS1 in the first direction D1. Although not shown, the second source/drain pattern 250 may be connected to the adjacent second sheet pattern NS2 in the first direction D1.

Figure 30:
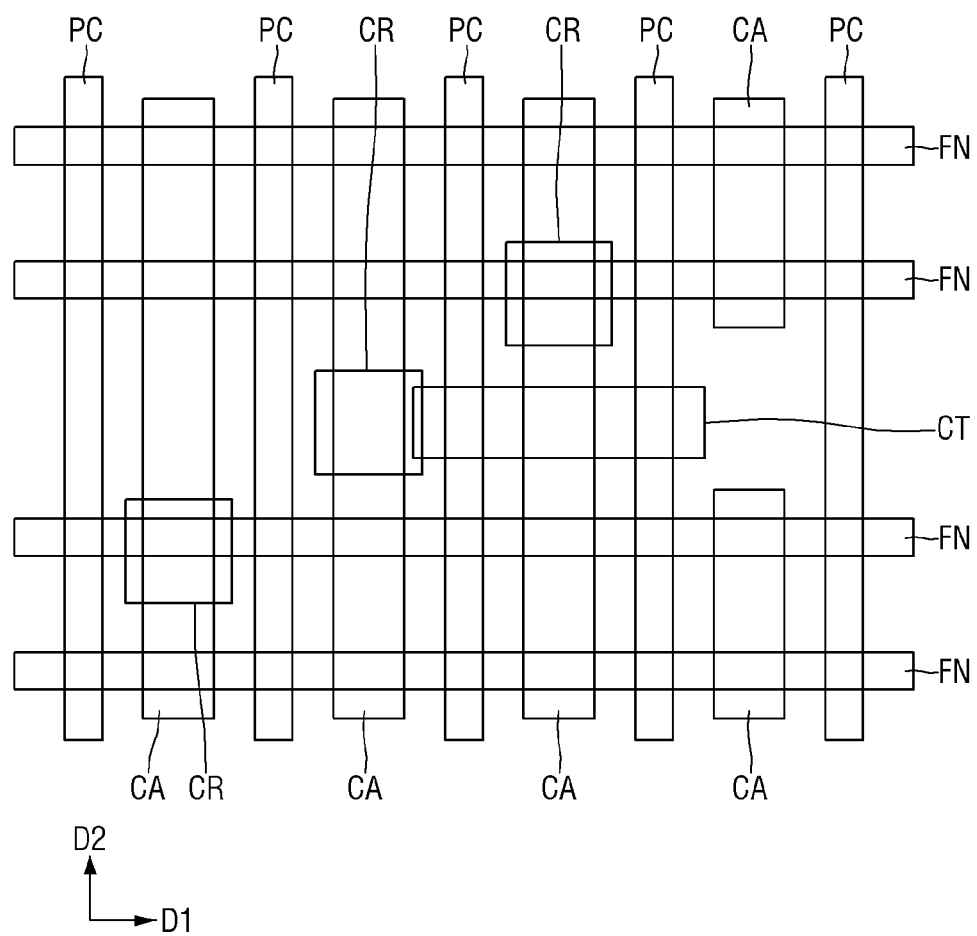
FIG. 30 is a diagram for explaining a method for disposing a layout of the semiconductor device according to some embodiments.

FIG. 30 is a diagram for explaining a method for disposing a layout of the semiconductor device according to some embodiments.

Referring to FIG. 30, a fin layer pattern FN extending in the first direction D1 and a gate layer pattern PC extending in the second direction D2 may be disposed in a grid form.

The fin layer pattern FN may be associated with the fin-shaped pattern described above. The gate layer pattern PC may be associated with the gate electrode described above.

A source/drain contact layer pattern CA may be disposed between the gate layer patterns PC adjacent to each other in the first direction D1. The source/drain contact layer pattern CA may, for example, intersect four fin layer patterns FN and may also intersect two fin layer patterns FN.

The source/drain contact layer pattern CA that intersects the four fin layer patterns FN may be associated with the aforementioned connection source/drain contact. The source/drain contact layer pattern CA that intersects the two fin layer patterns FN may be associated with the aforementioned source/drain contact.

A gate cut layer pattern CT may intersect the plurality of gate layer patterns PC. The gate cut layer pattern CT may be associated with the aforementioned first gate separation structure.

A contact blocking layer pattern CR may be disposed at a position where it overlaps the source/drain contact layer pattern CA. The contact blocking layer pattern CR may be associated with the position of the upper source/drain contact region described above.

In a layout arrangement in which the gate cut layer pattern CT intersects the plurality of gate layer patterns PC, the contact blocking layer pattern CR is disposed not to overlap a central portion of the gate cut layer pattern CT. On the other hand, the contact blocking layer pattern CR may be disposed to overlap an edge portion of the gate cut layer pattern CT.

In concluding the detailed description, those skilled in the art will appreciate that many variations and modifications may be made to the preferred embodiments without substantially departing from the principles of the present inventive concept. Therefore, the disclosed embodiments of the invention are used in a generic and descriptive sense only and not for purposes of limitation.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor device comprising:
   a first fin-shaped pattern which extends lengthwise in a first direction;
   a second fin-shaped pattern which is spaced apart from the first fin-shaped pattern in a second direction and extends lengthwise in the first direction;
   a first gate electrode extending lengthwise in the second direction on the first fin-shaped pattern;
   a second gate electrode extending lengthwise in the second direction on the second fin-shaped pattern;
   a first gate separation structure which separates the first gate electrode and the second gate electrode and is at the same vertical level as the first gate electrode and the second gate electrode; and
   a first source/drain contact extending lengthwise in the second direction on the first fin-shaped pattern and the second fin-shaped pattern,
   wherein the first source/drain contact includes a first lower source/drain contact region which intersects the first fin-shaped pattern and the second fin-shaped pattern, and a first upper source/drain contact region which protrudes from the first lower source/drain contact region, and
   wherein the first upper source/drain contact region does not overlap the first gate separation structure in the first direction.

2. The semiconductor device of claim 1, further comprising:
   a gate insulating film disposed between the first fin-shaped pattern and the first gate electrode,
   wherein the gate insulating film extends along a side wall of the first gate electrode and a side wall of the first gate separation structure.

3. The semiconductor device of claim 1, further comprising:
   a third gate electrode disposed on the first fin-shaped pattern and a fourth gate electrode disposed on the second fin-shaped pattern,
   wherein the third gate electrode and the fourth gate electrode are spaced apart from each other in the second direction, and
   wherein the first source/drain contact is disposed between the first gate electrode and the third gate electrode, and between the second gate electrode and the fourth gate electrode.

4. The semiconductor device of claim 3, further comprising:
   a second gate separation structure disposed between the third gate electrode and the fourth gate electrode,
   wherein the first gate separation structure and the second gate separation structure are separated from each other in the first direction.

5. The semiconductor device of claim 1, further comprising:
   a second source/drain contact extending lengthwise in the second direction, on the first fin-shaped pattern and the second fin-shaped pattern,
   wherein the first gate electrode and the second gate electrode are disposed between the first source/drain contact and the second source/drain contact, and
   wherein the second source/drain contact includes a second lower source/drain contact region that intersects the first fin-shaped pattern and the second fin-shaped pattern, and a second upper source/drain contact region that protrudes from the second lower source/drain contact region.

6. The semiconductor device of claim 5, wherein the second upper source/drain contact region does not overlap the first gate separation structure in the first direction.

7. The semiconductor device of claim 5, wherein the second upper source/drain contact region overlaps the first gate separation structure in the first direction.

8. The semiconductor device of claim 5, further comprising:
   a third gate electrode that intersects the first fin-shaped pattern and the second fin-shaped pattern, on the first fin-shaped pattern and the second fin-shaped pattern,
   wherein the second source/drain contact is disposed between the first gate electrode and the third gate electrode, and between the second gate electrode and the third gate electrode.

9. The semiconductor device of claim 5, further comprising:
   a third fin-shaped pattern adjacent to the first fin-shaped pattern in the first direction, a fourth fin-shaped pattern adjacent to the second fin-shaped pattern in the first direction, and an element separation structure which separates the first fin-shaped pattern and the third fin-shaped pattern, and the second fin-shaped pattern and the fourth fin-shaped pattern,
   wherein the element separation structure extends in the second direction along the second source/drain contact.

10. The semiconductor device of claim 1, further comprising:
    a gate capping pattern disposed on the first gate electrode,
    wherein an upper surface of the gate capping pattern is disposed on the same plane as the upper surface of the first upper source/drain contact region.

11. The semiconductor device of claim 1, further comprising:
    a sheet pattern which is spaced apart from the first fin-shaped pattern, on the first fin-shaped pattern,
    wherein the first gate electrode wraps the sheet pattern.

12. A semiconductor device comprising:
a first fin-shaped pattern and a second fin-shaped pattern each extending lengthwise in a first direction;
a third fin-shaped pattern spaced apart from the first fin-shaped pattern in a second direction and extending lengthwise in the first direction;
a fourth fin-shaped pattern spaced apart from the second fin-shaped pattern in the second direction and extending lengthwise in the first direction;
an element separation structure which separates the first fin-shaped pattern and the second fin-shaped pattern, and the third fin-shaped pattern and the fourth fin-shaped pattern;
a first source/drain contact extending lengthwise in the second direction, on the first fin-shaped pattern and the third fin-shaped pattern;
a first gate electrode extending lengthwise in the second direction, on the first fin-shaped pattern between the first source/drain contact and the element separation structure;
a second gate electrode extending lengthwise in the second direction, on the third fin-shaped pattern between the first source/drain contact and the element separation structure; and
a gate separation structure which separates the first gate electrode and the second gate electrode,
wherein the first source/drain contact includes a first lower source/drain contact region that intersects the first fin-shaped pattern and the third fin-shaped pattern, and a first upper source/drain contact region that protrudes from the first lower source/drain contact region,
wherein the first gate electrode and the second gate electrode each includes a first long side wall which faces the element separation structure and extends in the second direction, and a second long side wall opposite to the first long side wall, and
wherein the second long side wall of the first gate electrode and the second long side wall of the second gate electrode are bent toward the first source/drain contact, when approaching the gate separation structure.

13. The semiconductor device of claim 12, wherein the first upper source/drain contact region does not overlap the gate separation structure in the first direction.

14. The semiconductor device of claim 12, further comprising:
a second source/drain contact extending in the second direction, on the first fin-shaped pattern and the third fin-shaped pattern,
wherein the second source/drain contact is disposed between the first gate electrode and the element separation structure, and between the second gate electrode and the element separation structure, and
wherein the second source/drain contact includes a second lower source/drain contact region that intersects the first fin-shaped pattern and the third fin-shaped pattern, and a second upper source/drain contact region that protrudes from the second lower source/drain contact region.

15. The semiconductor device of claim 14, wherein the second upper source/drain contact region does not overlap the first gate separation structure in the first direction.

16. The semiconductor device of claim 14, wherein the second upper source/drain contact region overlaps the first gate separation structure in the first direction.

17. A semiconductor device comprising:
a first fin-shaped pattern extending lengthwise in a first direction;
a second fin-shaped pattern spaced apart from the first fin-shaped pattern in a second direction and extending lengthwise in the first direction;
a plurality of first gate electrodes extending lengthwise in the second direction, on the first fin-shaped pattern;
a plurality of second gate electrodes extending lengthwise in the second direction, on the second fin-shaped pattern;
a plurality of gate separation structures, each of which respectively separates a first gate electrode of the plurality of first gate electrodes and a corresponding second gate electrode of the plurality of second gate electrodes;
for each first gate electrode and gate separation structure, a gate insulating film extending along a side wall of the first gate electrode and a side wall of the gate separation structure;
a first source/drain pattern disposed between two adjacent first gate electrodes of the plurality of first gate electrodes and connected to the first fin-shaped pattern;
a second source/drain pattern disposed between two adjacent second gate electrodes of the plurality of second gate electrodes and connected to the second fin-shaped pattern; and
a first source/drain contact extending in the second direction, on the first source/drain pattern and the second source/drain pattern,
wherein the first source/drain contact includes a first lower source/drain contact region that intersects the first fin-shaped pattern and the second fin-shaped pattern, and a first upper source/drain contact region that protrudes from the first lower source/drain contact region, and
wherein the first upper source/drain contact region does not overlap at least one of the gate separation structures in the first direction.

18. The semiconductor device of claim 17, further comprising:
a second source/drain contact which is adjacent to the first source/drain contact in the first direction and extends in the second direction,
wherein the second source/drain contact includes a second lower source/drain contact region that intersects the first fin-shaped pattern and the second fin-shaped pattern, and a second upper source/drain contact region that protrudes from the second lower source/drain contact region, and
wherein the second upper source/drain contact region overlaps at least one of the gate separation structures in the first direction.

19. The semiconductor device of claim 18, further comprising:
a third gate electrode that intersects the first fin-shaped pattern and the second fin-shaped pattern, on the first fin-shaped pattern and the second fin-shaped pattern,
wherein the second source/drain contact is disposed between one of the plurality of first gate electrodes and the third gate electrode, and between one of the plurality of second gate electrodes and the third gate electrode.

20. The semiconductor device of claim 17, further comprising:
a second source/drain contact which is adjacent to the first source/drain contact in the first direction and extends in the second direction,
wherein the second source/drain contact includes a second lower source/drain contact region which intersects the first fin-shaped pattern and the second fin-shaped pattern, and a second upper source/drain contact region which protrudes from the second lower source/drain contact region, and wherein the second upper source/drain contact region does not overlap any of the gate separation structures in the first direction.

\* \* \* \* \*